(12) United States Patent
Summerfelt et al.

(10) Patent No.: US 6,635,498 B2
(45) Date of Patent: Oct. 21, 2003

(54) METHOD OF PATTERNING A FERAM CAPACITOR WITH A SIDEWALL DURING BOTTOM ELECTRODE ETCH

(75) Inventors: Scott R. Summerfelt, Garland, TX (US); Guoqiang Xing, Shanghai (CN); Luigi Colombo, Dallas, TX (US); Sanjeev Aggarwal, Plano, TX (US); Theodore S. Moise, IV, Dallas, TX (US)

(73) Assignees: Texas Instruments Incorporated, Dallas, TX (US); Agilent Technologies, Palo Alto, CA (US)

( * ) Notice: Subject to any disclaimer, the term of this patent is extended or adjusted under 35 U.S.C. 154(b) by 11 days.

(21) Appl. No.: 10/222,718

(22) Filed: Aug. 16, 2002

(65) Prior Publication Data

US 2003/0119211 A1 Jun. 26, 2003

Related U.S. Application Data

(60) Provisional application No. 60/342,662, filed on Dec. 20, 2001.

(51) Int. Cl.$^7$ .................. H01L 21/00; H01L 21/8242
(52) U.S. Cl. ................... 438/3; 438/238; 438/240; 438/253; 438/393
(58) Field of Search ............... 438/3, 396, 253, 438/254, 268, 240, 239, 393, 399, 238; 257/303, 306, 310, 295

(56) References Cited

U.S. PATENT DOCUMENTS

| | | | |
|---|---|---|---|
| 6,211,035 B1 | 4/2001 | Moise et al. | |
| 6,229,167 B1 * | 5/2001 | Ozawa | 257/295 |
| 6,261,967 B1 | 7/2001 | Athavale et al. | |
| 6,316,797 B1 | 11/2001 | Van Buskirk et al. | |
| 6,355,952 B1 * | 3/2002 | Yamoto et al. | 257/295 |
| 6,492,222 B1 * | 12/2002 | Xing | 438/240 |
| 6,500,678 B1 * | 12/2002 | Aggarwal et al. | 438/3 |
| 6,528,328 B1 * | 3/2003 | Aggarwal et al. | 438/3 |
| 2001/0034106 A1 | 10/2001 | Moise et al. | |

OTHER PUBLICATIONS

"FeRAM Tutorial", Ali Sheikholeslami and P. Glenn Gulak, A Survey of circuit innovations in Ferroelectric random–access memoies, Proceedings of the IEEE, vol. 88, No. 3, May, 2000, 3 pages, taken from the Internet at http://www.eecg-.toronto.edu/–ali/ferro/tutorial.html.

"A Survey of Circuit Innovations in Ferroelectric Random Access Memories", Ali Sheikholeslami and P. Glenn Gulak, Proceedings of the IEEE, vol. 88, No. 5, May, 2000, pp. 667–689.

* cited by examiner

Primary Examiner—Michael S. Lebentritt
(74) Attorney, Agent, or Firm—Jacqueline J. Garner; W. James Brady, III; Frederick J. Telecky, Jr.

(57) ABSTRACT

A method of fabricating a ferroelectric capacitor is disclosed. The method comprises the patterning of a top electrode layer and a dielectric layer to form a capacitor stack structure having sidewalls associated therewith. Prior to patterning the bottom electrode layer, a protective film is formed on the sidewalls of the capacitor stack structure in order to protect the dielectric material from conductive contaminants associated with a subsequent patterning of the bottom electrode layer.

38 Claims, 10 Drawing Sheets

METHOD OF PATTERNING A FERAM CAPACITOR WITH A SIDEWALL DURING BOTTOM ELECTRODE ETCH

RELATED APPLICATION

This application claims priority to Serial No. 60/342,662 filed Dec. 20, 2001, which is entitled "A Method of Patterning a FeRAM Capacitor with a Sidewall During Bottom Electrode".

CROSS-REFERENCE TO RELATED PATENT/PATENT APPLICATIONS

The following patents/patent applications are hereby incorporated herein by reference:

| Patent No./Ser. No. | Filing Date | TI Case No. |
| --- | --- | --- |
| 09/739,065 | Dec. 18, 2000 | TI-29966 |
| 09/741,650 | Dec. 19, 2000 | TI-29968 |
| 09/741,479 | Dec. 19, 2000 | TI-29969 |
| 09/741,675 | Dec. 19, 2000 | TI-29972 |
| 09/741,677 | Dec. 19, 2000 | TI-30077 |
| 09/741,688 | Dec. 19, 2000 | TI-30137 |
| 09/392,988 | Sep. 9, 1999 | TI-26586 |
| 09/105,738 | Jun. 26, 1998 | TI-25297 |
| 09/238,211 | Jan. 27, 1999 | TI-26778 |

FIELD OF THE INVENTION

The instant invention pertains to semiconductor device fabrication and processing and more specifically to a method of fabricating a ferroelectric memory device.

BACKGROUND OF THE INVENTION

Several trends exist presently in the semiconductor device fabrication industry and the electronics industry. Devices are continuously getting smaller and requiring less power. A reason for these trends is that more personal devices are being fabricated which are relatively small and portable, thereby relying on a small battery as its primary supply source. For example, cellular phones, personal computing devices, and personal sound systems are devices which are in great demand in the consumer market. In addition to being smaller and more portable, personal devices are requiring more computational power and on-chip memory. In light of all these trends, there is a need in the industry to provide a computational device which has memory and logic functions integrated onto the same semiconductor chip. Preferably, this memory will be configured such that if the battery dies, the contents of the memory will be retained. Such a memory device which retains its contents while power is not continuously applied thereto is called a non-volatile memory. Examples of conventional non-volatile memory include: electrically erasable, programmable read only memory ("EEPROM") and FLASH EEPROM.

A ferroelectric memory (FeRAM) is a non-volatile memory which utilizes a ferroelectric material, such as strontium bismuth tantalate (SBT) or lead zirconate titanate (PZT), as a capacitor dielectric situated between a bottom electrode and a top electrode. Both read and write operations are performed for an FeRAM. The memory size and memory architecture affects the read and write access times of an FeRAM. Table 1 illustrates exemplary differences between different memory types.

TABLE 1

| Property | SRAM | Flash | DRAM | FeRAM (Demo) |
| --- | --- | --- | --- | --- |
| Voltage | >0.5 V | Read >0.5 V Write (12 V) (±6 V) | >1 V | 3.3 V |
| Special Transistors | NO | YES (High Voltage) | YES (Low Leakage) | NO |
| Write Time | <10 ns | 100 ms | <30 ns | 60 ns |
| Write Endurance | $<10^{15}$ | $>10^5$ | $>10^{15}$ | $>10^{13}$ |
| Read Time (single/multibit) | <10 ns | <30 ns | <30 ns/<2 ns | 60 ns |
| Read Endurance | $>10^{15}$ | $>10^{15}$ | $>10^{15}$ | $>10^{13}$ |
| Added Mask for embedded | 0 | ~6–8 | ~6–8 | ~3 |
| Cell Size (F~metal pitch/2) | ~80 $F^2$ | ~8 $F^2$ | ~8 $F^2$ | ~18 $F^2$ |
| Architecture | NDRO | NDRO | DRO | DRO |
| Non volatile | NO | YES | NO | YES |
| Storage | I | Q | Q | P |

The non-volatility of an FeRAM is due to the bistable characteristic of the ferroelectric memory cell. An FeRAM cell may be selected by two concurrent X and Y voltage pulses, respectively, wherein X and Y correspond to a specific bit line and word line, respectively, identified by horizontal and vertical decoder circuitry. The FeRAM cells of the capacitor array which receive only one voltage pulse remain unselected while the cell that receives both an X and Y voltage signal flips to its opposite polarization state or remains unchanged, depending upon its initial polarization state, for example.

Two types of ferroelectric memory cells are used commonly, a single capacitor memory cell and a dual capacitor memory cell. The single capacitor memory cell (referred to as a 1T/1C or 1C memory cell) requires less silicon area (thereby increasing the potential density of the memory array), but is less immune to noise and process variations. Additionally, a 1C cell requires a voltage reference for determining a stored memory state. The dual capacitor memory cell (referred to as a 2T/2C or 2C memory cell) requires more silicon area, and it stores complementary signals allowing differential sampling of the stored information. The 2C memory cell is more stable than a 1C memory cell.

As illustrated in prior art FIG. 1, a 1T/1C FeRAM cell 10 includes one transistor 12 and one ferroelectric storage capacitor 14. A bottom electrode of the storage capacitor 14 is connected to a drain terminal 15 of the transistor 12. The 1T/1C cell 10 is read from by applying a signal to the gate 16 of the transistor (word line WL)(e.g., the Y signal), thereby connecting the bottom electrode of the capacitor 14 to the source of the transistor (the bit line BL) 18. A pulse signal is then applied to the top electrode contact (the plate line or drive line DL) 20. The potential on the bitline 18 of the transistor 12 is, therefore, the capacitor charge divided by the bitline capacitance. Since the capacitor charge is dependent upon the bistable polarization state of the ferroelectric material, the bitline potential can have two distinct values. A sense amplifier (not shown) is connected to the bitline 18 and detects the voltage associated with a logic value of either 1 or 0. Frequently the sense amplifier reference voltage is a ferroelectric or non-ferroelectric capacitor connected to another bitline that is not being read. In this manner, the memory cell data is retrieved.

A characteristic of a ferroelectric memory is that a read operation is destructive in some applications. The data in a memory cell is then rewritten back to the memory cell after the read operation is completed. If the polarization of the ferroelectric is switched, the read operation is destructive and the sense amplifier must rewrite (onto that cell) the correct polarization value as the bit just read from the cell. This is similar to the operation of a DRAM. If the drive line voltage was small enough not to switch the ferroelectric then the read operation was not destructive. In general, a non-destructive read requires a much larger capacitor than a destructive read and, therefore, requires a larger cell size.

As illustrated, for example, in prior art FIG. 2, a 2T/2C memory cell 30 in a memory array couples to a bit line ("bitline") 32 and an inverse of the bit line ("bitline-bar") 34 that is common to many other memory types (for example, static random access memories). Memory cells of a memory block are formed in memory rows and memory columns. The dual capacitor ferroelectric memory cell comprises two transistors 36 and 38 and two ferroelectric capacitors 40 and 42, respectively. The first transistor 36 couples between the bitline 32 and a first capacitor 40, and the second transistor 38 couples between the bitline-bar 34 and the second capacitor 42. The first and second capacitors 40 and 42 have a common terminal or plate (the drive line DL) 44 to which a signal is applied for polarizing the capacitors.

In a write operation, the first and second transistors 36 and 38 of the dual capacitor ferroelectric memory cell 30 are enabled (e.g., via their respective word line 46) to couple the capacitors 40 and 42 to the complementary logic levels on the bitline 32 and the bar—bar line 34 corresponding to a logic state to be stored in memory. The common terminal 44 of the capacitors is pulsed during a write operation to polarize the dual capacitor memory cell 30 to one of the two logic states.

In a read operation, the first and second transistors 36 and 38 of the dual capacitor memory cell 30 are enabled via the word line 46 to couple the information stored on the first and second capacitors 40 and 42 to the bar 32 and the bar—bar line 34, respectively. A differential signal (not shown) is thus generated across the bitline 32 and the bar—bar line 34 by the dual capacitor memory cell 30. The differential signal is sensed by a sense amplifier (not shown) which provides a signal corresponding to the logic level stored in memory.

A memory cell of a ferroelectric memory is limited to a finite number of read and write operations before the memory cell becomes unreliable. The number of operations that can be performed on a FeRAM memory is known as the endurance of a memory. The endurance is an important factor in many applications that require a nonvolatile memory. Other factors such as memory size, memory speed, and power dissipation also play a role in determining if a ferroelectric memory is viable in the memory market.

SUMMARY OF THE INVENTION

The following presents a simplified summary in order to provide a basic understanding of some aspects of the invention. This summary is not an extensive overview of the invention. It is intended to neither identify key or critical elements of the invention nor to delineate the scope of the invention. Rather, the primary purpose of this summary is to present some concepts of the invention in a simplified form as a prelude to the more detailed description that is presented later.

The present invention relates generally to the fabrication of an FeRAM device that is either a stand-alone device or one which is integrated onto a semiconductor chip that includes many other device types. Several requirements either presently exist or may become requirements for the integration of FeRAM with other device types. One such requirement involves utilizing, as much as possible, the conventional front end and backend processing techniques used for fabricating the various logic and analog devices on the chip to fabricate this chip which will include FeRAM devices. In other words, it is beneficial to utilize as much of the process flow for fabricating these standard logic devices (in addition to I/O devices and potentially analog devices) as possible, so as not to greatly disturb the process flow (thus increase the process cost and complexity) merely to integrate the FeRAM devices onto the chip.

The following discussion is based on the concept of creating the ferroelectric capacitors in an FeRAM process module that occurs between the front end module (defined to end with the formation of tungsten, which has the chemical symbol W, contacts) and backend process module (mostly metallization). Other locations of the FeRAM process module have also been proposed. For example, if the FeRAM process module is placed over the first layer of metallization (Metal-1) then a capacitor over bitline structure can be created with the advantage that a larger capacitor can be created.

Another possible location for the FeRAM process module is near the end of the back-end process flow. One advantage of this approach is that it keeps new contaminants in the FeRAM module (Pb, Bi, Zr, Ir, Ru, or Pt) out of more production tools. This solution is most practical if the equipment used after deposition of the first FeRAM film is dedicated to the fabrication of the FeRAM device structures and, therefore, is not shared. However, this solution may have the drawback of requiring FeRAM process temperatures compatible with standard metallization structures (suggested limitations discussed above). In addition, the interconnection of the FeRAM capacitor to underlying transistors and other needs of metallization may not be compatible with a minimum FeRAM cell size.

The requirements for the other locations will have many of the same concerns but some requirements may be different.

The FeRAM process module is preferably compatible with standard logic and analog device front-end process flows that include, for example, the use of tungsten contacts as the bottom contact of the capacitor. The FeRAM thermal budget is preferably low enough so that it does not impact substantially the front end structures such as the low resistance structures (which includes the tungsten plugs and silicided source/drains and gates) employed in many logic devices. In addition, transistors and other front end devices, such as diodes, may be sensitive to contamination. Contamination from the FeRAM process module, either direct (such as by diffusion in the chip) or indirect (cross contamination through shared equipment), should be addressed so as to avoid transistor and diode degradation. The FeRAM devices and process module should also be compatible with standard backend process flow. Therefore the FeRAM process module should have minimum degradation of logic metallization's resistance and parasitic capacitance between metal and transistor. In addition, the FeRAM devices should not be degraded by the backend process flow with minimal, if any modification. This is a significant challenge since ferroelectric capacitors have been shown to be sensitive to hydrogen degradation and most logic backend process flows utilize hydrogen and/or deuterium in many of the processes (such as in the formation of $SiO_2$ and $Si_3N_4$, CVD tungsten deposition, $SiO_2$ via etch, and forming gas anneals).

Commercial success of FeRAM also advantageously addresses minimization of embedded memory cost. Total memory cost is primarily dependent on cell size, periphery ratio size, impact of yield, and additional process costs associated with memory. In order to have cost advantage per bit compared to standard embedded memories such as embedded DRAM and Flash it is desirable to have FeRAM cell sizes that are similar to those obtained with standard embedded memory technology. Some of the methods discussed in this patent to minimize cell size include making the process flow less sensitive to lithography misalignment, forming the capacitor directly over the contact, and using a single mask for the capacitor stack etch. Some of the methods discussed in this patent, to reduce the added process cost, may require two additional masks for the FeRAM process module and a planar capacitor which reduces the complexity of the needed processes.

Although this patent focuses on using a planar capacitor, a three dimensional capacitor using post or cup structure can be fabricated using many of the same concepts and processes. The planar structure is illustrated because it uses a simpler process and is cheaper to make. The 3D capacitor is preferred when the planar capacitor area needed for minimum charge storage considerations limits the cell size. In this situation, the capacitor area enhancement associated with the 3D configuration allows a smaller planar cell size. DRAM devices have used this approach for many years in order to reduce cell area.

The present invention relates to a method of forming an FeRAM capacitor, wherein an etch associated with a bottom electrode layer does not adversely impact FeRAM capacitor integrity or performance. The present invention employs the addition of a protective layer or film on a sidewall of the capacitor stack after the patterning of the top electrode layer and the ferroelectric dielectric layer, but prior to the patterning of the bottom electrode layer. Subsequently, when the bottom electrode layer is patterned via, for example, an etch process, the sidewalls of the capacitor stack are protected from contamination associated with the bottom electrode layer. The protective sidewall layer thus prevents a shorting out of the capacitor or a leakage associated therewith due to conductive contaminants associated with the bottom electrode layer.

According to one exemplary aspect of the present invention, a method of forming an FeRAM capacitor is disclosed. The method comprises forming a bottom diffusion barrier layer over a substrate, and forming a bottom electrode layer, a ferroelectric dielectric layer and a top electrode layer thereon. The top electrode layer and the ferroelectric layer are then patterned to define a capacitor stack structure having sidewalls associated therewith. The method further comprises forming a protection layer over the capacitor stack structure, thereby covering an exposed portion of the bottom electrode layer as well as a top portion and the sidewalls of the capacitor stack structure.

The protection layer is then patterned, for example, by etching with a substantially anisotropic etch, thereby removing the material on the exposed portion of the bottom electrode layer as well as the top portion of the capacitor stack structure, and leaving a portion on the sidewalls of the capacitor stack structure. Subsequently, the bottom electrode layer is patterned. During such patterning, the protection layer on the sidewall of the capacitor stack structure protects the ferroelectric dielectric layer from contamination associated with the bottom electrode layer, thus preventing capacitor degradation, for example, due to leakage.

According to another aspect of the present invention, the protection layer comprises an AlOx film having a thickness sufficient to protect the sidewalls of the capacitor stack structure during the subsequent patterning of the bottom electrode layer. Such thickness may be a function of several factors; for example, the film thickness may depend upon the aspect ratio of the capacitor stack structure, the manner of forming the protection layer, step coverage of the protection layer, subsequent etch chemistry, etc. In accordance with one exemplary aspect of the invention, the sidewall thickness of the AlOx film is about 80 Angstroms or more and about 200 Angstroms or less.

According to yet another aspect of the present invention, the AlOx protection layer is formed over the capacitor stack structure via metal organic chemical vapor deposition using aluminum precursors. Alternatively, the protection layer may be formed via reactive sputtering. In addition, in one exemplary aspect, the AlOx protection layer is patterned using an etch that is selective with respect to the top electrode layer and the bottom electrode layer, respectively. For example, the AlOx protection may be etched using a dry etch with a $Cl_2$ and $O_2$ etch chemistry with a fluorine containing gas such as $CF_4$, CxFy or CxHyFz.

According to still another aspect of the present invention, the protection layer may comprise a multi-layer film such as an AlOx and an AlN film. For example, the multi-layer film may comprise an AlOx film followed by an AlN film formed thereover. In accordance with one example, the thickness of the AlN on the sidewall of the capacitor stack structure is about 400 Angstroms, and the AlOx and AlN films are formed via physical vapor deposition.

In the case of a multi-layer protection layer formed over the capacitor stack structure, the patterning of the protection layer may comprise a multi-step dry etch process, wherein the AlN film is first etched with a $Cl_2$ chemistry, and the AlOx film is subsequently etched with a $Cl_2$ and $O_2$ chemistry with a fluorine containing gas. In the above manner, the multi-layer protection layer is patterned in a substantially anisotropic manner, thereby removing portions associated with an exposed portion of the bottom electrode layer (not covered by the capacitor stack) and a top portion of the capacitor stack structure, while leaving a portion on the capacitor stack structure sidewalls for protection of the capacitor during a subsequent patterning of the bottom electrode layer.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

BRIEF DESCRIPTION OF THE DRAWINGS

Similar reference numerals are used throughout the figures to designate like or equivalent features. The figures are not drawn to scale. They are merely provided to illustrate various features associated with the present invention.

DETAILED DESCRIPTION OF THE DRAWINGS

Figure 1:
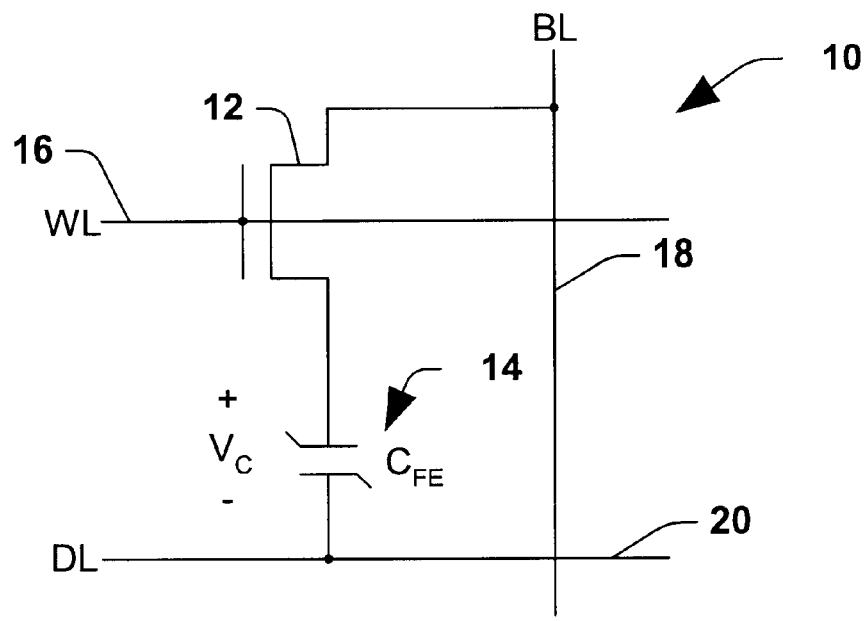
FIG. 1 is a prior art schematic diagram illustrating an exemplary 1T/1C FeRAM memory cell.
Figure 2:
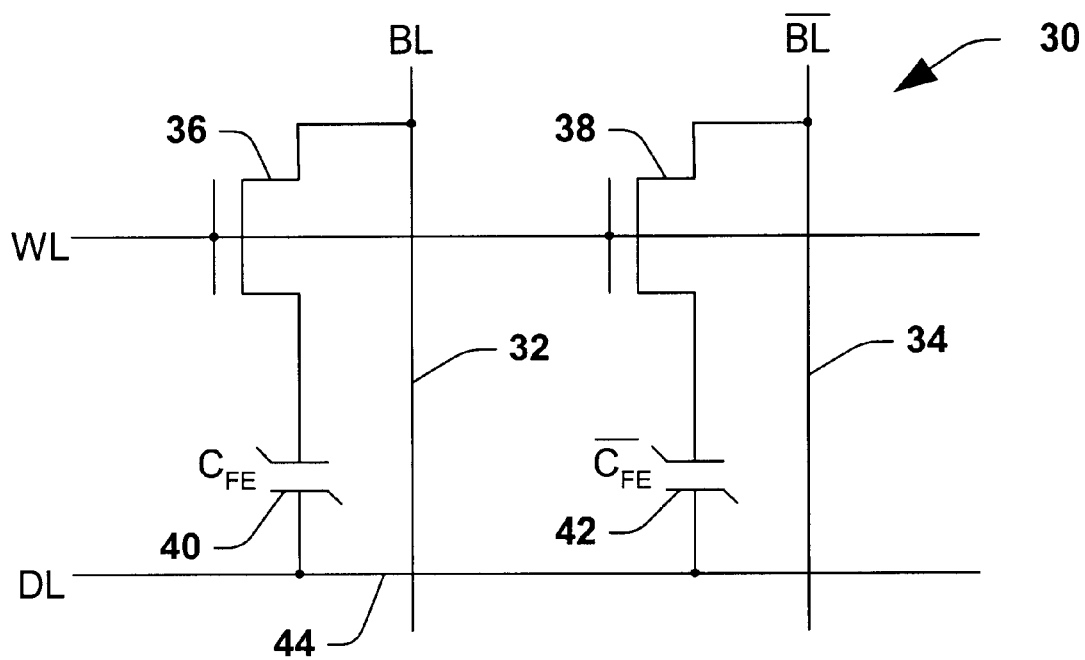
FIG. 2 is a prior schematic diagram illustrating an exemplary 2T/2C FeRAM memory cell.

While the following description of the instant invention revolves around the integration of the FeRAM devices with logic devices and other devices which can be found on a digital signal processor, microprocessor, smart card, microcomputer, microcontroller or system on a chip, the instant invention can be used to fabricate stand-alone FeRAM devices or FeRAM devices integrated into a semiconductor chip which has many other device types. In particular, the improved performance of the FeRAM device of the instant invention compared to standard semiconductor memories appears to make FeRAM the memory of choice for any handheld device which requires low power and large degree of device integration. The figures provided herewith and the accompanying description of the figures are merely provided for illustrative purposes. One of ordinary skill in the art should realize, based on the instant description, other implementations and methods for fabricating the devices and structures illustrated in the figures and in the following description. For example, while shallow trench isolation structures ("STI") are illustrated, any conventional isolation structures may be used, such as field oxidation regions (also known as LOCOS regions) or implanted regions. In addition, while structure 102 is preferably a single-crystal silicon substrate which is doped to be n-type or p-type, structure 102 (FIG. 1) may be formed by fabricating an epitaxial silicon layer on a single-crystal silicon substrate.

The present invention is directed generally to a method of forming an FeRAM capacitor which exhibits improved performance characteristics by reducing contamination of the capacitor stack associated with the patterning of the bottom electrode layer. For example, in defining the capacitor stack structure, the capacitor stack may be formed via a multi-step patterning process, wherein the top electrode layer is patterned, followed by the ferroelectric dielectric layer and the bottom electrode layer, respectively. In such instances, after the ferroelectric dielectric layer is etched, a sidewall portion of the capacitor is exposed, whereby electrically conductive contaminants may form or deposit thereat due to subsequent processing (e.g., a patterning of the bottom electrode layer), thereby resulting in device degradation due to leakage, for example, or even in some instances device inoperability due to a shorting out of the capacitor.

The present invention improves the performance of an FeRAM cell by reducing device degradation due to such contamination. In accordance with one exemplary aspect of the present invention, a method is disclosed in which a protection layer is formed over the capacitor stack structure after the patterning of the top electrode layer and the ferroelectric dielectric layer, respectively. The protection layer is then patterned, for example, via a substantially anisotropic dry etch process, thereby removing the protection layer on portions of the bottom electrode layer not covered by the capacitor stack structure as well as removing a portion of the protection layer on top of the capacitor stack structure, thereby leaving a portion of the protection layer on a sidewall of the stack. A subsequent patterning of the bottom electrode layer, which is electrically conductive, thus does not impact the capacitor stack integrity since the sidewall protection layer protects the capacitor stack structure from contamination associated with the bottom electrode layer patterning.

Figure 3:
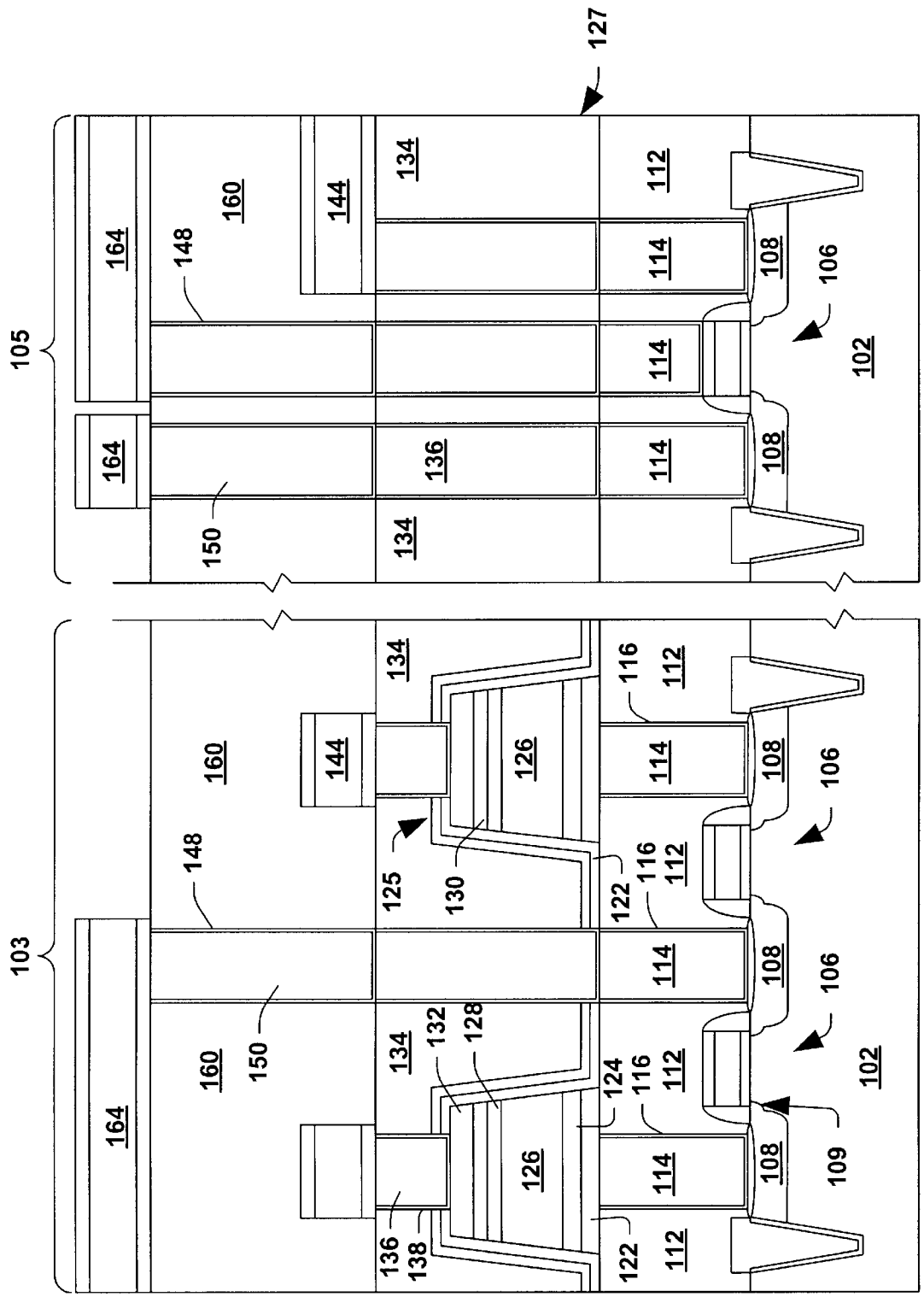
FIG. 3 is a fragmentary cross-sectional view of a partially fabricated device containing an FeRAM capacitor fabricated in accordance with one exemplary aspect of the present invention.

Referring initially to FIG. 3, an exemplary, fragmentary cross section of a semiconductor device 100 is provided in which two devices are illustrated. A first device 103 represents a partially fabricated version of am FeRAM cell in accordance with the present invention, and a second device 105 represents any high-voltage transistor, low-voltage transistor, high-speed logic transistor, I/O transistor, analog transistor, or any other device which may be included in a digital signal processor, microprocessor, microcomputer, microcontroller or any other semiconductor device. Except for the specific cell structure provided in the device 103, the structures utilized therein may be the same as the device structures of the device 105 (except for some possible variations in the transistors due to the different device types that device 105 may be).

Basically, gate structures 106 include a gate dielectric (for example, comprising silicon dioxide, an oxynitride, a silicon nitride, BST, PZT, a silicate, any other high-k material, or any combination or stack thereof), a gate electrode (for example, comprising polycrystalline silicon doped either p-type or n-type with a silicide formed on top, or a metal such as titanium, tungsten, TiN, tantalum, TaN or other type metal). The gate structures 106 further comprise side wall insulators (for example, comprising an oxide, a nitride, an oxynitride, or a combination or stack thereof). In general, the generic terms oxide, nitride and oxynitride refer to silicon oxide, silicon nitride and silicon oxy-nitride. The term "oxide" may, in general, include doped oxides as well, such as boron and/or phosphorous doped silicon oxide. Source/drain regions 108 may be formed via, for example, implantation using conventional dopants and processing conditions. Lightly doped drain extensions 109 as well as pocket implants may also be utilized. In addition, the source/drain regions 108 may be silicided (for example, with titanium, cobalt, nickel, tungsten or other conventional silicide material).

Figure 4:
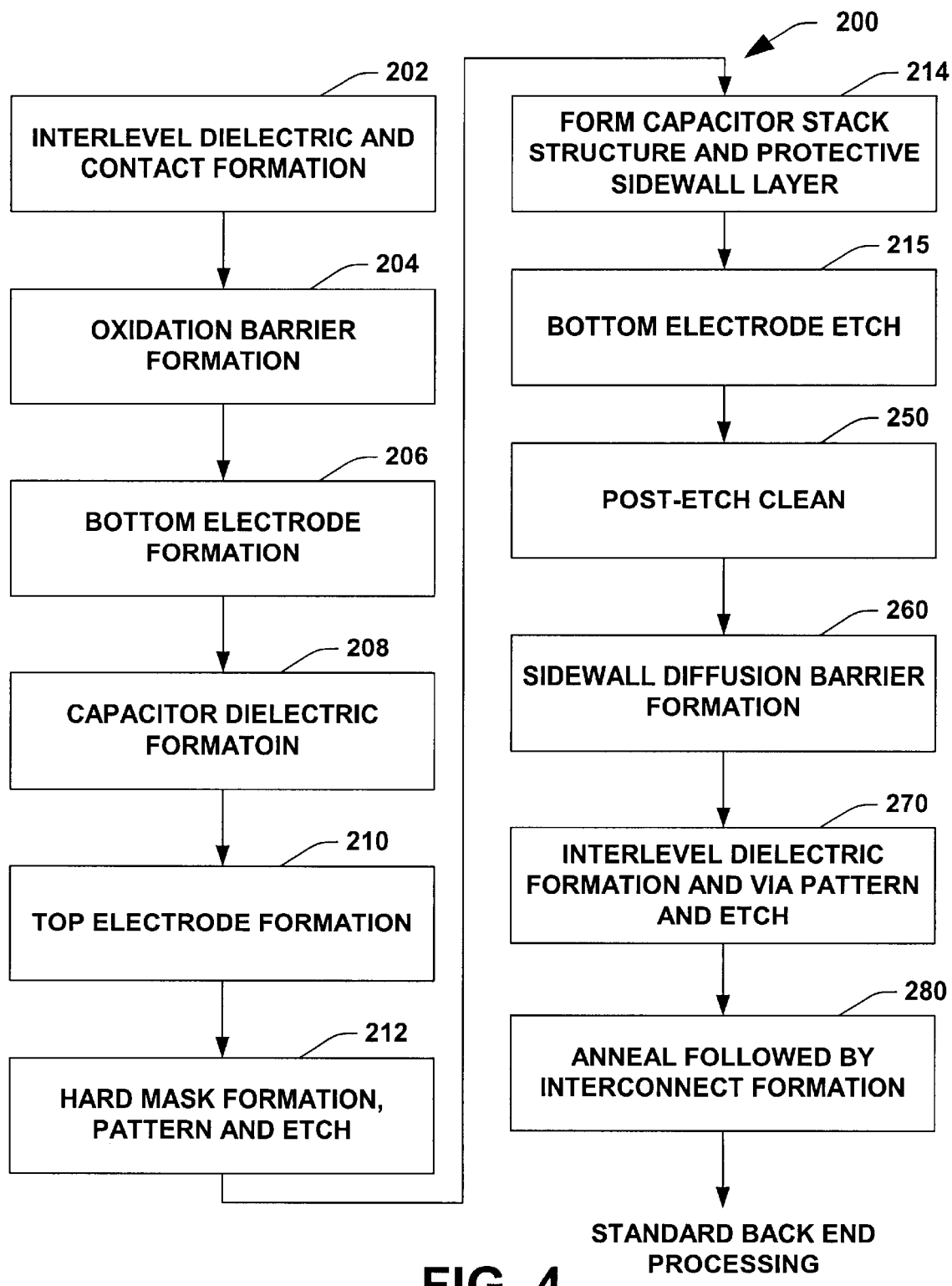
FIG. 4 is a flow chart diagram illustrating a method of forming an FeRAM capacitor in accordance with another exemplary aspect of the present invention.

A dielectric layer 112 is formed over the entire substrate 102 and is patterned and etched so as to form openings for contacts to the substrate and gate structures 106 to be formed (see, e.g., step 202 of FIG. 4). These openings are filled subsequently with one or more conductive materials, such as a plug 114 (for example, comprising a metal such as tungsten, molybdenum, titanium, titanium nitride, tantalum nitride, or a metal suicide such as Ti, Ni or Co, copper or doped polysilicon). A liner/barrier layer 116 may or may not be formed between the plug 114 and dielectric 112. Such a liner/barrier layer 116 is illustrated in FIG. 3 and comprises, for example, Ti, TiN, TaSiN, Ta, TaN, TiSiN, a stack thereof, or any other conventional liner/barrier material. Preferably, the contacts are formed so as to land on the silicided regions of the source/drain regions and gate structures.

The dielectric layer 112 comprises, for example, $SiO_2$ (doped or undoped with preferable dopants such as boron or phosphorous) possibly with a layer of hydrogen or deuterium containing silicon nitride next to the gate. After deposition of the diffusion barrier 116 it is likely that the barrier will be planarized for improved lithography of overlying layers using a process such as chemical mechanical polishing (CMP). In addition, an added diffusion barrier/etch stop (not shown) may be included near the top surface of layer 112 such as AlOx, AlN, $Si_3N_4$, $TiO_2$, $ZrO_2$, or $TaO_x$ that would be deposited after the planarization process. This diffusion barrier is particularly useful if damascene processes are used to create the via or metallization to the contact. The formation of the plug 114 will require etching through this optional barrier/etch stop.

Formation of metal structures which are situated above the contacts is considered to be part of the back end processes. Other than the specific FeRAM process module, the back end process steps may be those standard in the semiconductor industry. The metallization may be, for example, either Al or Cu based. The Al is preferably etched while the Cu is preferably used in a damascene approach. However, etching Cu and Al formed in a damascene process is also possible. According to one example, aluminum metallization will preferably have CVD tungsten plugs or Al plugs, and the Al will preferably be Cu-doped for improved electromigration resistance. Metal diffusion barriers for Al may include, for example, TiN and/or Ti. Copper metallization may have, for example, Cu or W plugs with either Ti, TiN, TiSiN, Ta, tantalum nitride, and/or TaSiN diffusion barriers.

A thin dielectric layer (not shown) may be formed between each of the interlevel dielectric (ILD) layers (layers 112, 134 and 160). If formed, this thin dielectric comprises, for example, silicon nitride, silicon carbide, SiCNO or a silicon oxide (for example, a high-density plasma oxide). In addition, interlevel dielectric layers 112, 134, and 160 may comprise, for example, an oxide, FSG, PSG, BPSG, PETEOS, HDP oxide, a silicon nitride, silicon oxynitride, silicon carbide, silicon carbo-oxy-nitride, a low dielectric constant material (for example, SiLK, porous SiLK, teflon, low-K polymer (possibly porous), aerogel, xerogel, BLACK DIAMOND, HSQ, or any other porous glass material), or a combination or stack thereof. The interconnects and the metal lines preferably comprise the same material. Plugs 136 and 150 and conductors 144 and 164 comprise a metal material (for example, copper, aluminum, titanium, TiN, tungsten, tungsten nitride, or any combination or stack thereof). A barrier/liner may be formed between the plug and the respective interlevel dielectric layer. If formed, the barrier/liner layer (shown as layers 138 and 148 and liners 142, 146, 162 and 166) comprises, for example, Ti, TiN, W, tungsten nitride, Ta, tantalum nitride, any conventional barrier/liner layer, or any combination or stack thereof). The interlayer dielectric and plug material should be compatible with the FeRAM thermal budget. With existing technology (i.e., one that incorporates a W plug and $SiO_2$ ILD), the FeRAM thermal budget should be less than approximately 600 or 650 C., however, the present invention is not limited thereto. If the ILD is modified to include a low dielectric constant ("low K") layer, the FeRAM thermal budget may need to be reduced further. The preferred interlayer dielectric 112 is therefore a material that can withstand a thermal budget in excess of 600 C., such as silicon oxide (doped and/or undoped), silicon nitride, and/or silicon oxy-nitride.

Level 127 is added so as to accommodate the FeRAM cells (FeRAM process module). This FeRAM process module allows the creation of ferroelectric or high dielectric constant capacitors to be easily added with maximum thermal budget for the new process module yet not impact the thermal budget of backend process. In particular, this level allows FeRAM devices with capacitor under bitline configuration compatible with a high-density memory. However, it is possible, if planarity is not a necessity, to form the FeRAM devices while not forming layer 127 in region 105. Hence, the FeRAM portion 103 would be taller than the region 105 by the height of layer 127.

Initially, a further discussion of FIG. 3 will be provided to appreciate the structure of an FeRAM cell and an exemplary integration position of such a cell within a semiconductor fabrication process. Subsequently, a flow chart and a number of fragmentary cross section diagrams will be provided to illustrate an exemplary process for fabricating such an FeRAM cell in order to provide a context in which the present invention may reside. In conjunction therewith, the present invention will be described and illustrated in greater detail. It should be understood, however, that although the present invention will be shown and described in conjunction with one exemplary context, the invention is applicable to other fabrication methodologies, structures and materials, and such alternatives are contemplated as falling within the scope of the present invention.

An FeRAM capacitor, as illustrated in FIG. 3 at reference numeral 125, resides above the interlayer dielectric 112, and comprises several layers. The FeRAM capacitor 125 of FIG. 3 comprises an electrically conductive barrier layer 122 upon which a conductive bottom capacitor electrode 124 resides (hereinafter, the terms conductive and insulative are employed to indicate electrically conductive and electrically insulative, respectively, unless indicated otherwise). A capacitor dielectric layer 126, a ferroelectric material, is formed over the bottom electrode 124, and is covered by, for example, a conductive multi-layer top electrode 128, 130. A top portion of the FeRAM capacitor 125 comprises a hard mask layer 132 which, as will be discussed in greater detail later, may be employed to facilitate the capacitor stack etch. The capacitor stack is then covered by a multi-layer sidewall diffusion barrier 118, 120.

An exemplary method of forming an FeRAM capacitor in accordance with the present invention which is similar in many respects to the capacitor 125 of FIG. 3 will now be discussed in conjunction with FIGS. 4, 5 and 6a–6n, respectively. As the method of the present invention results in differences from the capacitor 125 of FIG. 3, such differences will be noted, illustrated and discussed. As stated above, conductive diffusion and/or oxidation barrier layer 122 may or may not be formed depending on whether the plug 114 needs to be protected during subsequent processing, for example, of the capacitor dielectric. If formed at step 204 of FIG. 4, as illustrated in FIG. 6a, the conductive barrier layer 122 comprises, for example, TiAlN or other possible barriers (some of which have a slow oxidation rate compared to TiN) which include: TaSiN, TiSiN, TiN, TaN, HfN, ZrN, HfAlN, CrN, TaAlN, CrAlN, or any other conductive material. A thickness 302 of this layer is, preferably, on the order of 60 nm (for a 0.18 um via). In the future, scaling the via size will allow scaling of the barrier thickness as well. One exemplary deposition technique for the barrier layer is a reactive sputter deposition using $Ar+N_2$ or $Ar+NH_3$. It should be noted that Ar is a standard inert gas used for sputter deposition or physical etching based on cost and performance. It is possible to use other inert gases instead of Ar for these applications throughout the process described in this document. Other deposition techniques that might be used include, for example, chemical vapor deposition (CVD) or plasma enhanced CVD (PECVD).

Figure 6A:
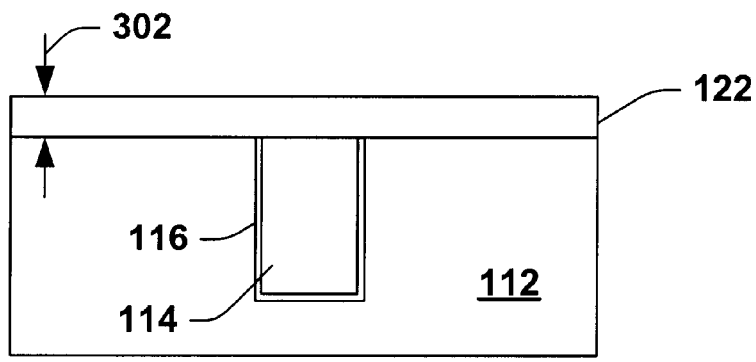
FIGS. 6a–6n are fragmentary cross-sectional views illustrating various steps of forming an FeRAM cell in accordance with yet another exemplary aspect of the present invention.
Figure 6B:
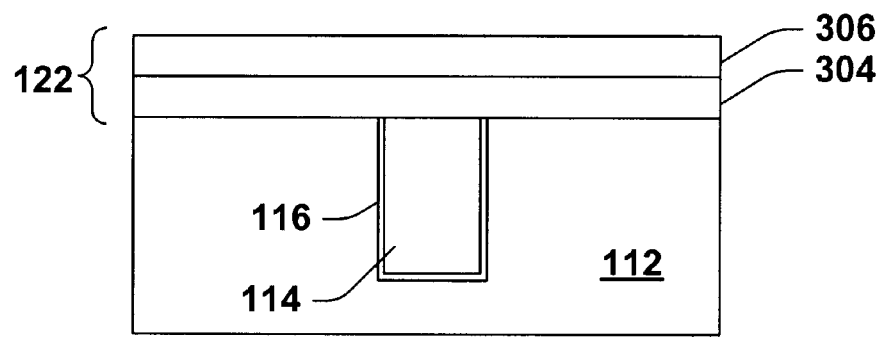

CVD of nitrides actually results in carbo-oxy-nitrides especially when metalorganic precursors are used and this is also acceptable in many cases. For the preferred W contact it is preferred to deposit a bilayer diffusion barrier, as illustrated in FIG. 6b. First, a CVD TiN layer 304 (for example, about 40 nm thick) is deposited followed by a PVD TiAlN layer 306 (for example, about 30 nm thick). Even more preferred would be CVD or PECVD deposition of TiAlN (~60 nm thick). The preferred proportion of aluminum in TiAlN is around 30% or more and about 60% or less Al and about 40% or more and about 50% or less is more preferred in order to have improved oxidation resistance. A better diffusion barrier will, in general, allow the oxygen stable bottom electrode material (to be formed later) to be thinner or permit a higher process temperature to be used.

Figure 6C:
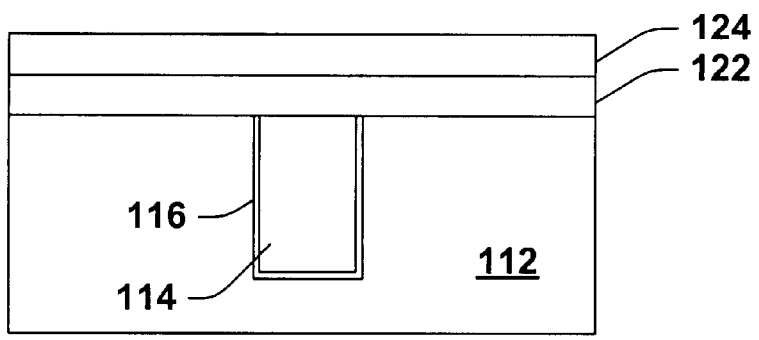

The bottom electrode 124 of the capacitor is formed at step 206 of FIG. 4 either on the barrier layer 122 or directly on the interlevel dielectric layer 112 so as to make electrical connection with the underlying contact structure, as illustrated in FIG. 6c. Preferably, the bottom electrode 124 is around 25 nm thick or more and about 100 nm thick or less, is stable in oxygen, and is comprised of a noble metal or conductive oxide, for example, iridium, iridium oxide, Pt, Pd, PdOx, Au, Ru, $RuO_x$, Rh, $RhO_x$, $LaSrCoO_3$, (Ba,Sr)$RuO_3$, $LaNiO_3$ or any stack or combination thereof. For any electrode using noble metals, it is advantageous, from a cost and ease of integration standpoint, to use layers which are as thin as possible. A desirable bottom electrode for a PZT capacitor dielectric is either about a 50 nm thick Ir or a stack comprised of about 30 nm thick IrOx and about 20 nm thick Ir, which is formed, for example, by sputter deposition for Ir (Ar) and/or reactive sputter deposition (Ar+$O_2$) for IrOx. Lower ferroelectric deposition temperatures might allow even thinner electrodes, which may be desired. Another alternative deposition technique comprises chemical vapor deposition.

In order to control the stress of the bottom electrode, a post formation bottom electrode anneal may be performed for stress relaxation and/or to improve the microstructure/stability of the bottom electrode. Exemplary anneal conditions are about 400 C. or more and about 600 C. or less for about 2 min or more and about 10 min or less in an oxygen or an inert gas mixture. This anneal may be performed at any time after the formation of the bottom electrode, but preferably prior to the formation of the ILD 160.

Figure 6D:
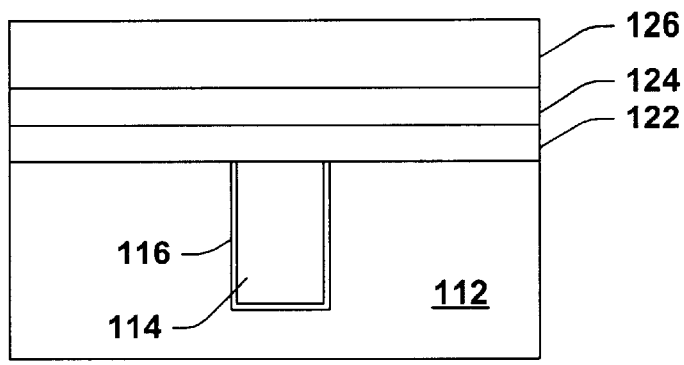

The capacitor ferroelectric dielectric layer 126 is formed at step 208 of FIG. 4 over the bottom electrode layer 124, for example, as illustrated in FIG. 6d. Preferably, the ferroelectric dielectric 126 is less than about 150 nm thick (more preferably less than about 100 nm thick, and most preferably less than about 50 nm thick) and comprises of a ferroelectric material, such as Pb(Zr,Ti)$O_3$ (PZT—lead zirconate titanate); doped PZT with donors (Nb, La, Ta), acceptors (Mn, Co, Fe, Ni, Al), and/or both; PZT doped and alloyed with SrTiO3, BaTiO3 or CaTiO3; strontium bismuth tantalate (SBT) and other layered perovskites such as strontium bismuth niobate tantalate (SBNT); or bismuth titanate; BaTiO 3; PbTiO3; or Bi2TiO3.

PZT is a desirable choice for the ferroelectric dielectric 126 because it has the highest polarization and the lowest processing temperature of the aforementioned materials. In addition, an exemplary Zr/Ti composition is around 20/80, respectively, in order to obtain good ferroelectric switching properties (for example, large switched polarization and relatively square-looking hysterisis loops). Alternatively, Zr/Ti compositions of approximately 65/35 may be employed to maximize uniformity in capacitor properties. Further, it is advantageous to have donor doped PZT with roughly about 0.05 to about 1% donor dopant because the donor dopant improves the reliability of the PZT by helping to control the point defect concentrations.

One exemplary and desirable deposition technique for these dielectrics is metal organic chemical vapor deposition (MOCVD). MOCVD is advantageous especially for thin films (for example, films less than about 100 nm thick). Thin PZT is extremely advantageous in making integration more simple (less material to etch), less expensive (less material to deposit and therefore less precursor) and allows lower voltage operation (lower coercive voltage for roughly the same coercive electric field). The capacitor dielectric 126 may be deposited in either a crystalline/poly-crystalline state or it can be deposited in an amorphous phase at low temperatures and then crystallized using a post-deposition anneal, which is commonly employed for Bi ferroelectric films. The post deposition crystallization anneal can be performed immediately after deposition or after later process steps such as electrode deposition or post capacitor etch anneal. The preferred MOCVD PZT approach results in a poly-crystalline film deposited at temperatures preferably between about 450 C. or more and about 600 C. or less (more preferred between about 500 and about 550 C.).

Alternatively, the dielectric layer 126 may be formed using a chemical solution deposition (for example, sol-gel or metal organic decomposition). In addition, one exemplary Zr/Ti composition is around 20/80 to obtain good ferroelectric switching properties (for example, large switched polarization and relatively square looking hysteresis loop). Alternatively, a Zr/Ti composition of around 65/35 may be employed in order to minimize switched polarization and uniformity in capacitor properties. Additionally, it may be desirable to have donor doped PZT with roughly 0.5 to 1% donor dopant. The donor dopant improves the reliability of the PZT by helping to control the point defect concentrations. The MOCVD process conditions, if employed, are desirably preformed at a temperature less than around 600 C. (even more preferred to be less than 550 C.). The deposition rate of the PZT is set to be between 100 and 200 nm/min. In order to have reproducible control of film composition, the MOCVD process may use two or even one cocktail of metalorganic precursors mixed together with a solvent to keep it a liquid. The MOCVD reactor is designed to vaporize the liquids with either one or two vaporizers and precisely control the reactor wall temperatures to prevent the precursors from either decomposing or condensing. An Ar or He carrier gas is, preferably, used to flow the precursors to the reactor chamber or showerhead where they are mixed with an oxidizer ($O_2$, $N_2O$, or $H_2O$, with $O_2$ preferred).

Figure 6E:
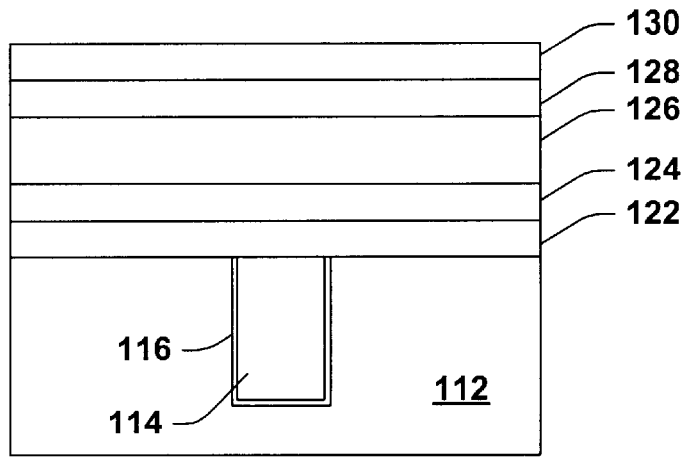

The top electrode layer(s) 128, 130 is formed at step 210 of FIG. 4 on the capacitor dielectric layer 126, for example, as illustrated in FIG. 6e. In this exemplary aspect of the present invention, the top electrode is a multi-layer 128, 130; however, the top electrode can be implemented in just one layer. In one example, the first layer 128 comprises iridium oxide (for example, less than about 100 nm thick and more preferably less than about 50 nm thick), and the second layer 130 comprised iridium (for example, less than about 100 nm thick and more preferably less than about 50 nm thick). In particular, it is advantageous for Pb based ferroelectrics to have a conductive oxide top electrode such as $IrO_x$, $RuO_x$, $RhO_x$, $PdO_x$, $PtO_x$, $AgO_x$, (Ba,Sr)$RuO_3$, $LaSrCoO_3$, $LaNiO_3$, $YBa_2Cu_3O_{7-x}$ rather than a pure noble metal so as to minimize degradation due to many opposite state write/read operations (fatigue). Many of the Bi-containing ferroelectrics, such as SBT, can also use noble metal electrodes such as Pt, Pd, Au, Ag, Ir, Rh, and Ru and still retain good fatigue characteristics.

If the top electrode 128, 130 is an oxide, it is advantageous to have a noble metal layer above it in order to maintain low contact resistance between the top metal contact and oxide. For example, it is possible that a TiN layer in contact with IrOx might form $TiO_2$, which is thermally insulating, during subsequent thermal processes. For any electrode using a noble metal such as Pt, Ru, Pd, or Ir, it is advantageous, from a cost and integration standpoint, to use as thin a layer as possible. For PZT electrodes, the preferred top electrode stack 128, 130 is comprised of approximately 10 nm Ir deposited by PVD in Ar on approximately 20 nm IrOx deposited by reactive PVD in $Ar+O_2$ on top of the PZT capacitor dielectric. IrOx is preferred to be deposited below about 400 C. in gas mixtures of between about 50% and about 80% $O_2$ with the rest oxygen with a relatively low sputter power and hence a slow deposition rate (for example, less than about 20 nm/min).

It is possible to anneal the top electrode prior to deposition of a hard mask in order to control the stress in the top electrode 128, 130. For example, sputter deposited electrodes will typically be subject to compressive stress while, the stress in annealed electrode will be tensile.

Figure 6F:
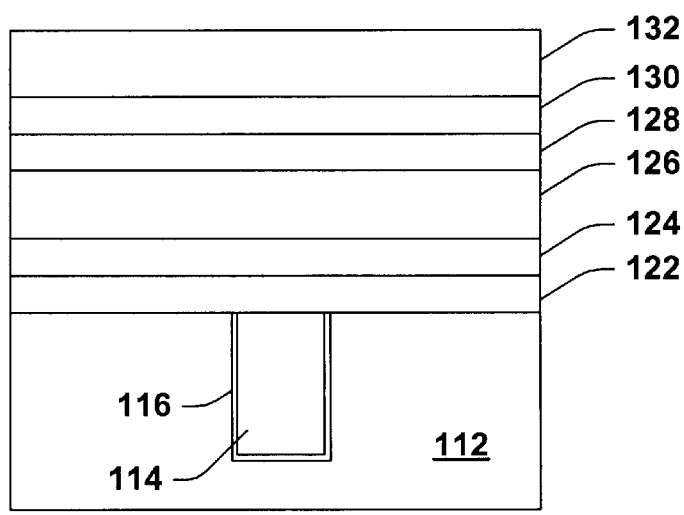

Conventionally, the entire capacitor stack was patterned and etched in a progressive series of etch steps, beginning with the top electrode 128, 130 and continuing down to the barrier layer 122, typically using a different etchant for some of the layers. If multiple layers or all of the layers are etched simultaneously, then a hard mask layer 132 may be formed at step 212 of FIG. 4 over the layers, as illustrated in FIG. 6f. Preferably, the hard mask 132 is comprised of a material which is thick enough so as to retain its integrity during subsequent etch processing. The hard mask may be, for example, around 50 to 500 nm thick (more preferably around 100 to 300 nm thick—most preferably around 200 nm thick) and, for example, comprises TiAlN, TiN, Ti, $TiO_2$, Al, AlOx, AlN, TiAl, TiAlOx, Ta, TaOx, TaN, Cr, CrN, CrOx, Zr, ZrOx, ZrN, Hf, HfN, HfOx, silicon oxide, low-k dielectric, or any stack or combination thereof. An example of a hard mask stack is 300 nm of PECVD deposited $SiO_2$ on 50 nm of sputter deposited TiAlN or TiN.

The hard mask thickness is controlled by the subsequent etch processing and the relative etch rates of the various materials, the thicknesses of the etched layers, the amount of overetch required, and the desired remaining hard mask thickness after etching all of the layers. Thinner layers result in thinner hard masks. The hard mask may or may not be removed after the etching of the capacitor stack. If hard mask 132 is not removed, as illustrated in FIG. 3, then it is preferable to form the hard mask of a conductive material. However, a non-conductive or semiconductive material may be used, but the interconnection to the top electrode of the capacitor should preferably be formed through this hard mask (not shown) so as to make direct connection to the top electrode.

The deposition of the hard mask may be a single or multi-layer stack of different materials in order to better control the hard mask profile and remaining hard mask thickness. The preferred deposition process for metal nitride hard masks is sputter deposition using $Ar+N_2$ gas mixtures. One exemplary deposition process for silicon oxide containing hardmasks is TEOS PECVD.

In another example, a hard mask stack is 30 nm of TiAlN on 120 nm of TiAl, which is formed on 20 nm TiAlO which is formed on 50 nm of TiAlN. All of these layers are, for example, deposited by sputter deposition in the same chamber where the film composition is changed during the deposition by varying the gas composition ($Ar+N_2$ (50/50) for nitride, Ar for metal, and $Ar+O_2$ (90/10) or $Ar+N_2+O_2$ (85/10/5) for oxide). The TiAlN is, for example, deposited at around. 400 C. with high power to achieve roughly 100 nm/min TiAlN deposition rate. The TiAlN can be replaced by TiN for all of these cases.

After the contact formation, several different, deposition steps have been described. In particular, bottom diffusion barrier (step 204), bottom electrode (step 206), ferroelectric (step 208), top electrode (step 210) and hard mask (step 212). It is likely that all or nearly all of the pieces of equipment used in these process steps will be considered potentially contaminated by ferroelectric elements. Therefore these pieces of equipment generally will be dedicated. The wafers will most likely have a significant, if not a high, contamination level on the backside of the wafers. The next process step after hardmask deposition is typically lithography. It is likely that processing wafers with backside contamination through this tool will contaminate the tool and hence result in contamination of clean wafers processed through this tool with FeRAM contaminates on their backside. Therefore, it is preferred to clean the backsides of the FeRAM wafers so as to be able to share the lithography equipment and allow clean wafers to be processed through the lithography equipment without any FeRAM contamination.

If the hard mask 132 includes standard materials such as $SiO_2$ then the backside of the wafers might be cleaned prior to deposition of this later part of the hardmask. For example, if the hardmask is comprised of $SiO_2$ on TiAlN then it is preferred to clean the backside of the wafer after the TiAlN deposition process and before the $SiO_2$ deposition process. This will prevent the $SiO_2$ deposition tool from being contaminated, and, hence, allow it to be shared.

The cleaning process depends on the backside contamination elements and their contamination levels. Assuming the preferred approach (PVD barrier, hardmask, bottom electrode, top electrode and MOCVD PZT), there will be low levels of Ir on the backside, but continuous films thereof assuming the MOCVD process does not have edge exclusion. Therefore for this type of wafer contamination the preferred backside wafer clean process is a wet etch process that etches the back, edges and small region on the frontside of the wafer near the edge. The etch process is somewhat dependent on the materials present on the backside of the wafer (for example if it is Si, $SiO_2$ or $Si_3N_4$). Wet etching PZT preferably is accomplished using either a strong fluorine acid or an acid mixture with chlorine and fluorine etch chemistries, such as $H_2O+HF+HCl$ or $H_2O+NH_3F+HCl$.

As stated above, conventionally, the top electrode layer 128, 130, the dielectric layer 126 and the bottom electrode layer 124 (along with the barrier layer 122) were etched consecutively to form a capacitor stack. The inventors of the present invention identified a problem associated with such a consecutive etch process. In particular, it was discovered that after etching the top electrode layer 128, 130 and the ferroelectric layer 126, the etching of the bottom electrode layer 124 (which is an electrically conductive material) caused conductive contaminants associated therewith to sometimes form or deposit on exposed sidewall edges of the patterned ferroelectric dielectric layer 126. Such contaminants were discovered to potentially degrade the performance characteristics of the resulting capacitor, for example, by undesirably increasing leakage associated therewith. In some extreme cases, such excess contamination may even short out the electrodes of the capacitor structure, thereby rendering the resulting FeRAM cell inoperable.

One Aspect of the Present Invention

Therefore the present invention addresses the above problem identified and appreciated by the inventors by discontinuing the capacitor stack etch process after patterning the ferroelectric dielectric layer 126, and forming a protective layer on sidewalls of a capacitor stack structure defined by the patterned top electrode layer 128, 130 and the ferroelectric dielectric layer 126 at step 214 of FIG. 4 prior to a patterning of the bottom electrode layer 124 (step 215 of FIG. 4), thereby protecting the capacitor stack structure from potential contaminants associated with patterning of the bottom electrode layer. Additional details associated therewith will be discussed below in conjunction with an example illustrated in FIGS. 4, 5 and 6g–6i, respectively.

Figure 5:
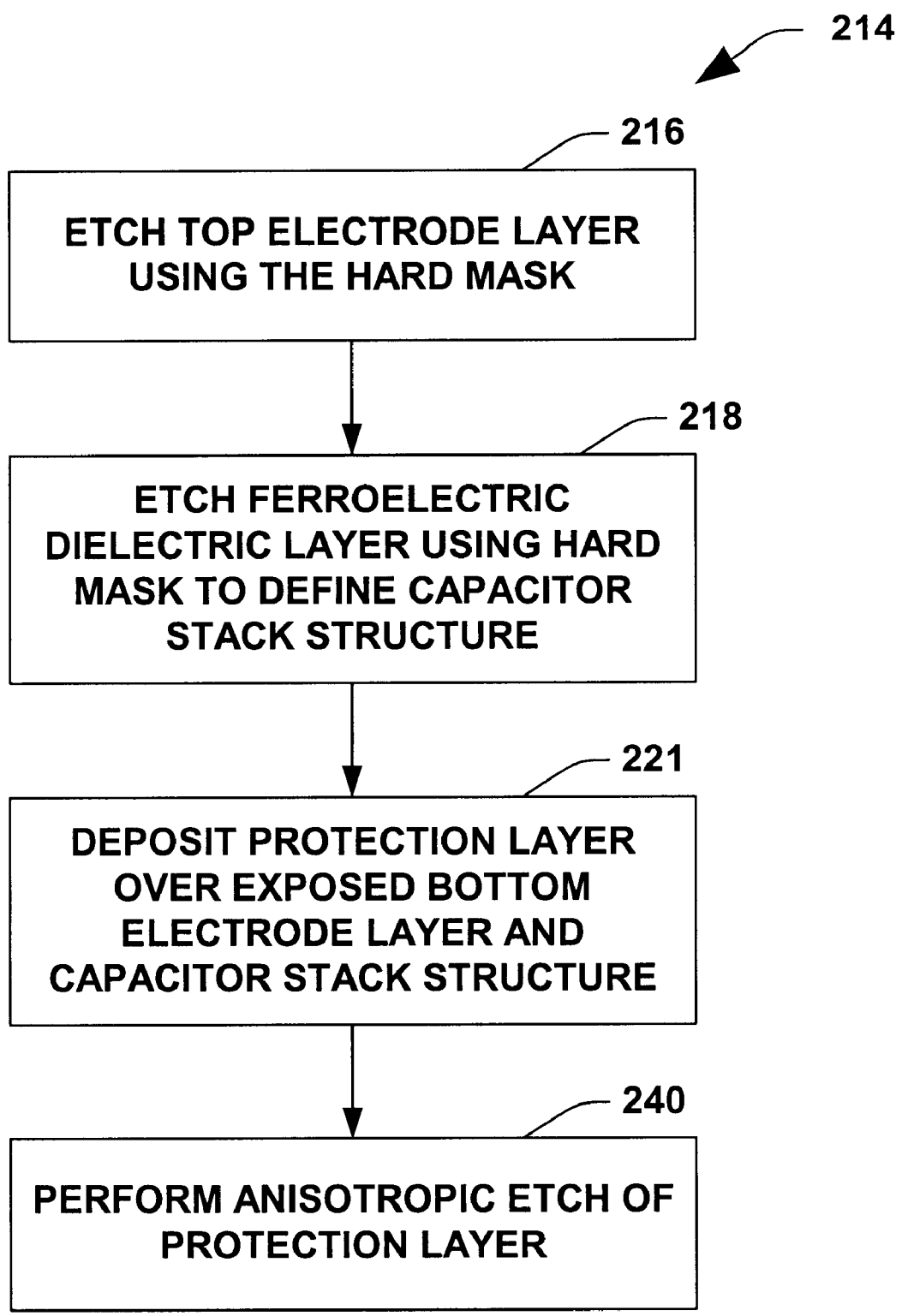
FIG. 5 is a flow chart diagram illustrating a method of forming a capacitor stack structure and a protection sidewall layer or film thereon in accordance with still another exemplary aspect of the present invention.
Figure 6G:
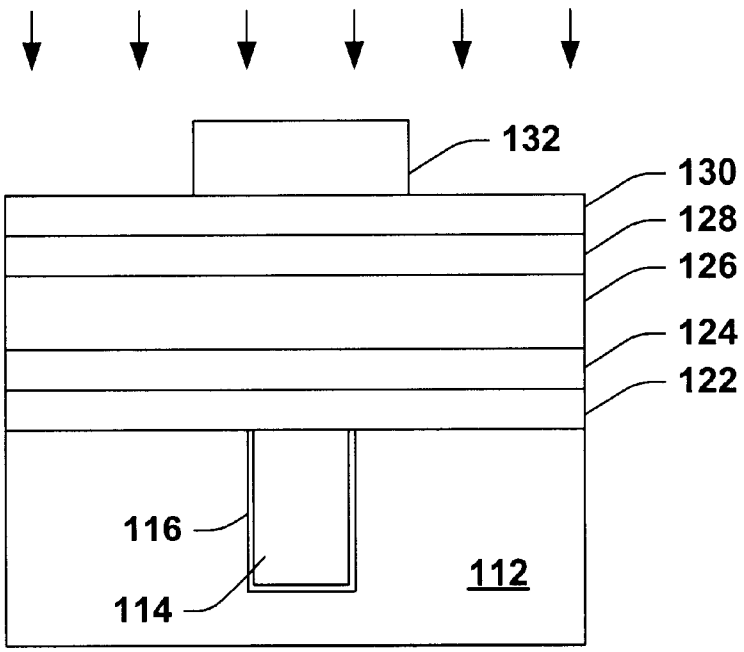
Figure 6H:
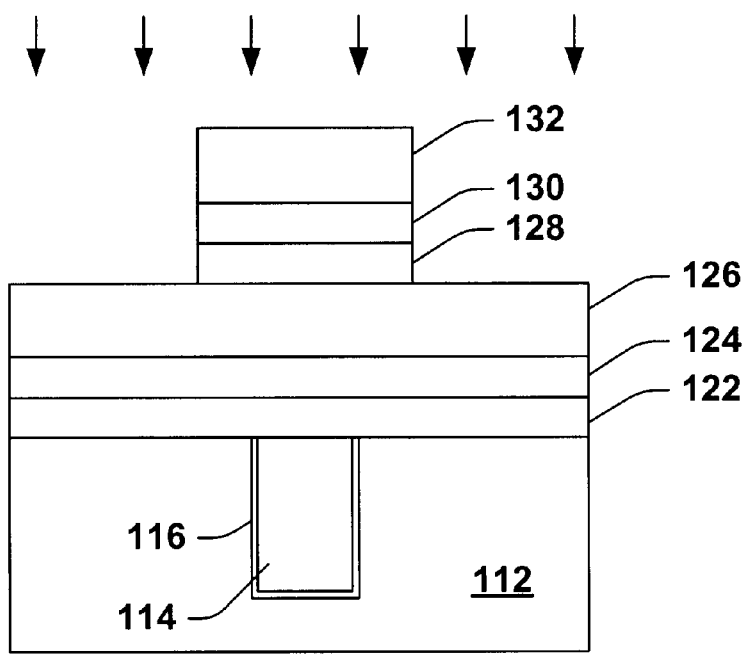
Figure 6I:
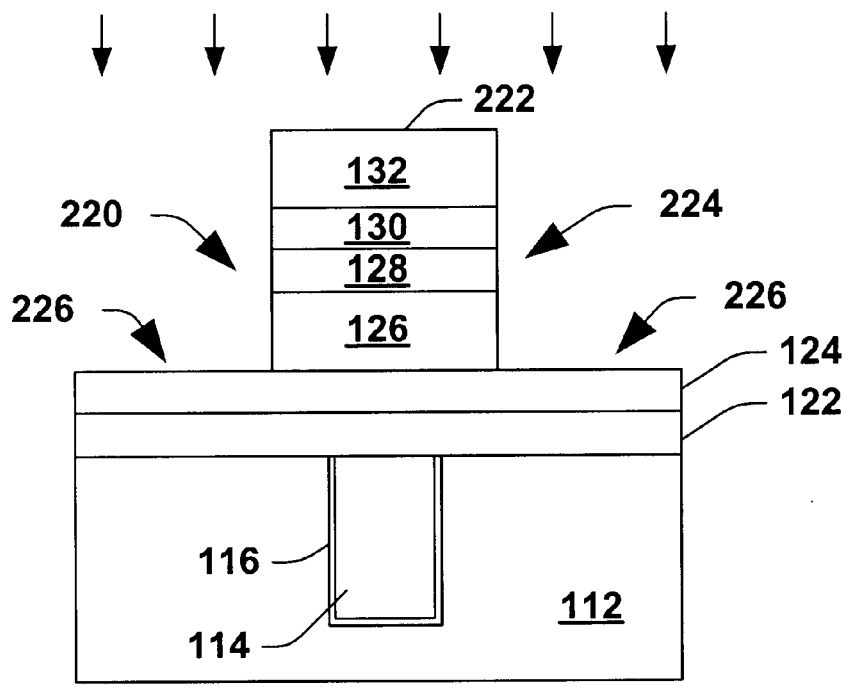
Figure 6J:
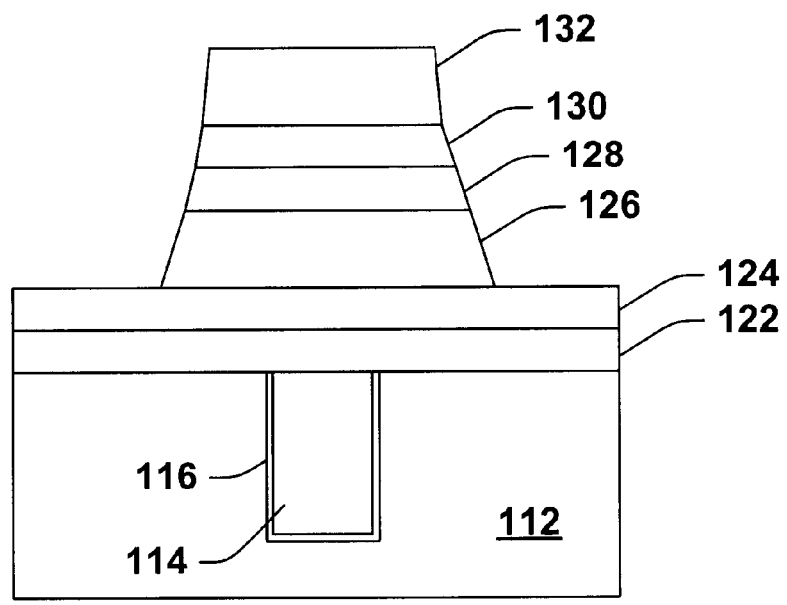

As illustrated in FIGS. 6g–6i, the hard mask 132 is patterned (at step 212 of FIG. 4) followed by the formation of a capacitor stack structure and a protective sidewall layer thereon at step 214. The formation of the capacitor stack structure is further illustrated in FIG. 5, wherein a patterning of the top electrode 128, 130, is performed at 216 via, for example, etching (see, e.g., FIG. 6h). Subsequently, the ferroelectric dielectric layer 126 is also patterned at 218 via, for example, etching, as illustrated in FIG. 6i. Note that in FIG. 6i, the patterning of the top electrode layer 128, 130 and the dielectric layer 126 results in a capacitor stack structure 220 (which may include the hard mask 132), having a top portion 222 and sidewalls 224 associated therewith. The formation of the capacitor stack structure 220 results in a portion 226 of the underlying bottom electrode layer 124 being exposed. Note that in FIG. 6i, the patterning of the capacitor stack structure 220 appears to result in nearly vertical sidewalls 224, however, FIG. 6i is provided merely for ease of explanation, and it should be understood that the sidewalls 224 of the capacitor stack structure 220 are typically sloped slightly based on the anisotropy of the patterning process employed, as illustrated, for example, in FIG. 6j.

Etching both layers with the same hard mask is not only cheaper but also allows the cell size to be smaller by eliminating misalignment tolerances which are necessary if more than one lithography step is used. As mentioned before, the preferred approach is to use the hard mask 132 with multiple etch processes. This etch process can be modified by using elevated temperatures in order to achieve even steeper sidewall slopes and, therefore, less critical dimension (CD) growth. In general, it is preferred to minimize CD growth and this can be achieved by having a steeper etch profile and/or by having thinner layers. The low temperature etch process of one embodiment of the instant invention which utilizes a hard mask achieves sidewall slopes of roughly 74 degrees for the PZT and Ir structures, while the TiAlN structure profile is steeper. The etch rate of Ir and PZT (slow etch rate materials) is roughly 100 nm/min.

For example, an etch process for the top electrode layer (and also the bottom electrode layer 124 which will follow after the formation of a protective sidewall) may be a $Cl_2+O_2$ or a $Cl_2+CO$ etch chemistry with either $N_2$ or Ar as potential additives. Preferably, $Cl_2+O_2$ is employed with $N_2$ added. For a Ti containing hard mask, the $O_2$ is preferably >5–10%. In addition, the etch may occur in a high density plasma (e.g., 1200 W) with an intermediate substrate bias (e.g., 300 W on chuck), at an intermediate pressure (e.g., 10 mTorr), and at a relatively high temperature (e.g., 350–400 C.).

In accordance with another example, the hard mask and top electrode are etched as follows. The etch approach uses one high-density plasma etch chamber to etch all the hard mask, top electrode layer, and dielectric layer using a process sequence in the same chamber. In each case the remote plasma density is set to near maximum power. The hard mask is first etched using chlorine chemistries (unless a $SiO_2$ hard mask is used, in which case a fluorine and chlorine chemistries are used). An exemplary TiAlN etch recipe comprises a $Cl_2$ and $N_2$ (80/20) etchant with a pressure around 10 mTorr and medium substrate bias. If TiAlOx is part of the hard mask then a short high power step may be added so as to break through this layer. Alternatively, the hard mask is etched using a $Cl_2+BCl_3$ etch process where the amount of BCl3 is dependent on the amount of TiAlON. After etching the hard mask, the resist is removed using $O_2$ and $N_2$ (85/15) at a pressure around 40 mTorr and a small substrate bias. The Ir/IrOx top electrode is, for example, etched using a $Cl_2+N_2+O_2$ chemistry (60/20/20) at high bias (around 100 nm/min etch rate) at lower pressures (around 3 mTorr). The oxygen is added to insure a high selectivity between the Ir etch and the TiAlN hard mask etch.

Yet another exemplary patterning approach uses a high temperature etch process to etch low volatility species near room temperature such as Ir, IrOx and PZT. The process sequence is therefore listed below. For an $SiO_2$ hard mask, the $SiO_2$ is first etched in a dedicated $SiO_2$ etch chamber (fluorine chemistries only) using standard $SiO_2$ etch chemistry. The resist is then removed using standard ash process (such as $O_2+N_2+H_2O+$ optional $CF_4$). The TiAlN (underneath the $SiO_2$) will be etched in the high temperature etch chamber prior to the Ir preferably using similar chemistries and powers as discussed before but with a higher pressure (15–20 mTorr). For a TiAlN hard mask, a near room temperature etch chamber is used with process conditions similar to those discussed above. The resist can be removed in that chamber or in a dedicated chamber as well. The Ir/IrOx top electrode, PZT, IrOx/Ir bottom electrode and TiAlN bottom electrode diffusion barriers will be etched at high temperature using etch recipes similar to that discussed at room temperatures except the chamber pressure will be between 10–20 mTorr.

In addition, an exemplary etch process for the ferroelectric dielectric layer 126 will depend upon the type of ferroelectric material employed. For example, for a PZT material, an etch chemistry may include $Cl_2$ plus fluorine gas plus an oxidizer (e.g., $O_2$ or CO). For example, $Cl_2+O_2+CH_2F_2$ may be employed in a high density plasma (e.g., 1200 W) at an intermediate pressure (e.g., 10 mTorr), at a substrate bias of about 450 W RF on chuck, at a temperature of about 350–400 C. Alternatively, a $BCl_3$ chemistry with Ar may be implemented. Note that in FIGS. 5g–5j, the capacitor stack etch is illustrated is purely anisotropic for simplicity. However, the actual etch will not have vertical sidewalls, but rather will exhibit sloped sidewalls, as illustrated in FIG. 5k.

Alternatively, if PZT is the dielectric employed, the PZT may be etched in a reactive chemistry containing chlorine and fluorine (for example $Cl_2+CF_4+N_2+O_2$ (45/15/20/20)) at intermediate pressures (around 10 mTorr) and a high substrate bias (around 100 nm/min etch rate). Again, the oxygen is added to insure good selectivity between PZT etch rate and hard mask etch rate and also to minimize oxygen loss from the PZT.

The etch process is a relatively dirty process and hence it is likely that the etch tool and the frontside, edge and backside of the wafers will have FeRAM contamination or have etch residues with FeRAM contamination. It is, therefore, necessary to clean the frontside of the wafer and chemically remove etch residues and possibly remove a thin layer of damaged PZT. This post-capacitor-etch wet-clean may, with some etch conditions and chemistries, be as simple as a deionized water (DI water or DIW) clean (tank soak with or without megasonic followed by a spin rinse-dry) or the tank etch might be acid-based in order to improve the clean or remove more damage. The etch process can also result in redeposition of conductive material such as noble metals on the sidewall. For example, with Ir bottom electrodes it is possible to redeposit Ir on the sidewalls of the PZT which would result in unacceptably high leakage current for the capacitor. The wet clean (step 250 of FIG. 4) can be used to also remove this unwanted material using chemistries that etch a little of the ferroelectric material and also will keep the unwanted material in solution. The backside and edges of the wafer are likely to be significantly contaminated by redeposition of FeRAM elements. They should be removed prior to processing in a shared tool.

The capacitor etch of step 214 of FIG. 4 results in damage or degradation of the ferroelectric which needs to be recovered. One method to recover this damage is by $O_2$ plasma exposure (to recover any oxygen loss that might have occurred) and/or a RTA or furnace anneal in an inert or oxidizing atmosphere (to add oxygen and to improve the crystallinity of the damaged surfaces created by the etch process. For PZT this anneal is preferably performed around 500–650 C. (for a furnace anneal the duration is preferably around 15 min to 2 hr) or 550–700 C. (for a RTA the duration is preferably around 10 sec to 60 sec).

Figure 6K:
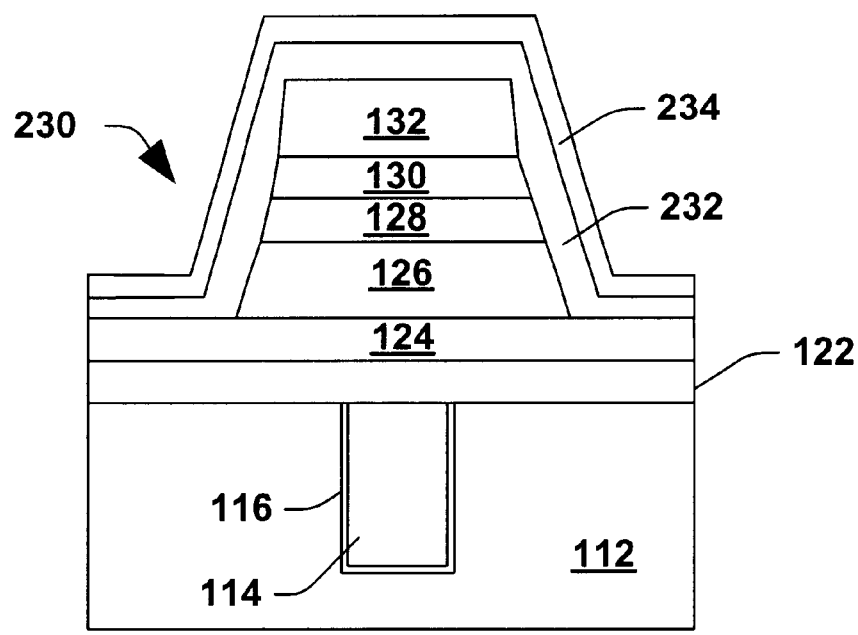

Once the capacitor stack structure 220 has been defined at 216 and 218, a protection layer 230 is formed over the structure 220 (at 221 of FIG. 5), thereby covering a top portion 222 of the stack 220, as well as the exposed portion 226 of the bottom electrode layer 124, as illustrated in FIG. 6k. In accordance with one exemplary aspect of the present invention, the protection layer 230 is a multi-layer film as illustrated, however, the layer 230 may be a single layer. The protection layer 230 comprises an electrically insulative material which advantageously may be selective with respect to the hard mask layer 132 (or top electrode 128, 130 if the hard mask is not present) and the bottom electrode layer 124, respectively.

In accordance with one exemplary aspect of the present invention, the protection layer 230 comprises a layer 232 of AlOx, having a thickness of, for example, about 100 Angstroms or more and about 200 Angstroms or less, followed by a second layer 234 of AlN having a thickness of, for example, about 400 Angstroms. The thickness of the layers 232, 234 may vary based on the step coverage of the materials along the sidewalls 224 of the capacitor stack structure 220. Since the protection layer 230 will subsequently be patterned, it is desirable that the thickness of the layers 232, 234 be sufficient to maintain a layer of protective material on the sidewall 224, which is thick enough to prevent contamination of the capacitor. For example, an AlOx thickness of about 80 to 200 Angstroms or more on the sidewall may be desirable, however, other thicknesses are not precluded by the present invention.

In accordance with the above example, AlOx and AlN are provided as a multi-layer protection layer 230 primarily because AlOx forms at a relatively slow rate. Accordingly, AlN may be supplemented because it forms relatively more quickly, thereby providing a sufficiently thick protective material in a relatively short amount of time. Although AlOx and AlN are two materials highlighted in the above example, it should be understood that other electrically insulative materials may also be employed as the protection layer 230 and any such material is contemplated as falling within the scope of the present invention.

In accordance with one exemplary aspect of the present invention the formation of an AlOx film for layer 232 is formed via metal organic chemical vapor deposition with aluminum precursors. In one example, the metal organic CVD process may be employed with an ambient gas such as $O_2$, $H_2O$, NO, $NO_2$ or $O_3$. Alternatively, the AlOx layer 232 may be formed via reactive sputtering using an aluminum target with an ArO or an ArN ambient gas. Such reactive sputtering may be employed with RF power or pulsed DC power in a deposition chamber having a pressure of about 5 mTorr. In such an instance, if ArO is employed, an Ar/O gas ratio may be about 20% or more oxygen and about 60% or less oxygen. Alternatively, if an ArN gas is utilized, an Ar/N gas ratio may be about 30% or more nitrogen and about 70% or less nitrogen.

The protection layer 230 is then patterned at 240 of FIG. 5 in a substantially anisotropic matter. In so doing, portions of the layer 230 overlying the exposed portion 226 of the bottom electrode layer and a top portion 222 of the capacitor stack 220 are removed while a portion 242 covering the sidewalls 224 of the capacitor stack structure 220 remain covered (for example, in a manner similar to the formation of sidewall spacers). A result of such substantially anisotropic patterning is illustrated, for example, in FIG. 6l.

According to one exemplary aspect of the present invention, a patterning of the protection layer 230 is performed by a substantially anisotropic dry etch process. For example, in the case of a single layer AlOx film, the etch may be performed with a $Cl_2$ and $O_2$ etch chemistry along with a fluorine containing gas such as $CF_4$, CxFy, or CxHyFz. In another instance, where a multi-layer AlN and AlOx protection layer is employed, a $Cl_2$ etch chemistry may be utilized for the AlN with the $Cl_2$, $O_2$ and fluorine containing gas combination for the AlOx, for example. In another embodiment, the AlOx is etched using an $BCl_3$+Ar etch. Alternatively, other substantially anisotropic etch or patterning processes may be employed and are contemplated as falling within the scope of the present invention.

Figure 6L:
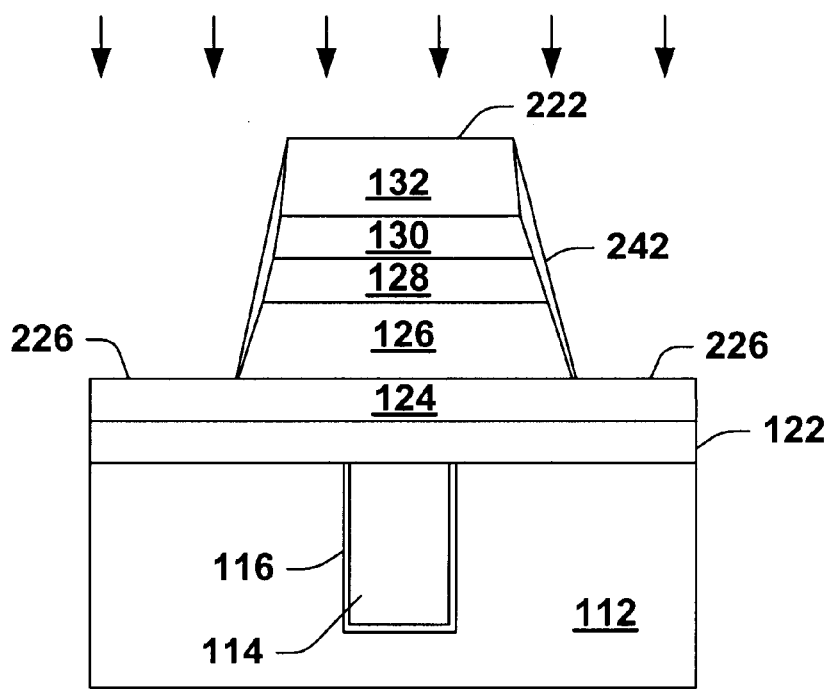
Figure 6M:
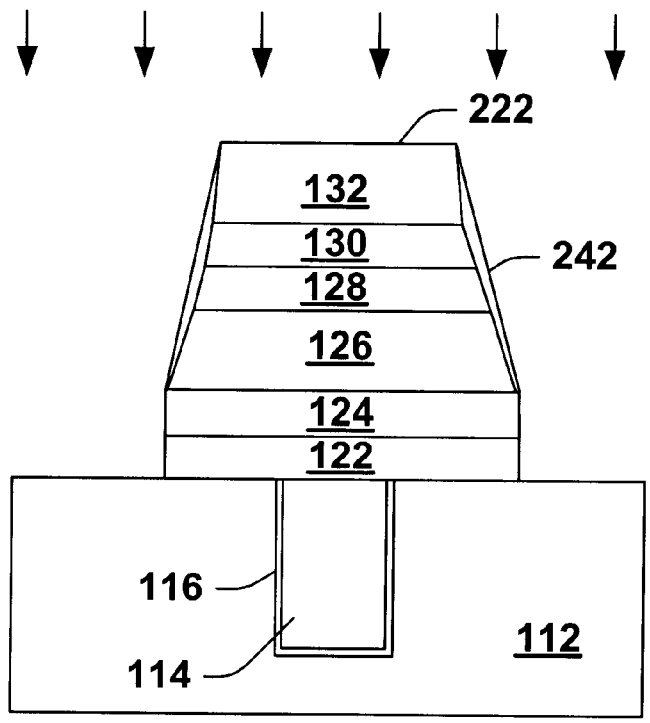

After patterning of the protection layer 230, a protective film 242 resides on the sidewalls of the capacitor stack structure 220, as illustrated in FIG. 6l. The bottom electrode layer 124 is then patterned, for example, using a $Cl_2$+$O_2$ or a $Cl_2$+CO etch chemistry with either $N_2$ or Ar as potential additives, as illustrated in FIG. 6m. Preferably, $Cl_2$+$O_2$ is employed with $N_2$ added. In addition, the etch may occur in a high density plasma (e.g., 1200 W) with an intermediate substrate bias (e.g., 300 W on chuck), at an intermediate pressure (e.g., 10 mTorr), and at a relatively high temperature (e.g., 350–400 C.). The etch examples provided above are for tools configured for 8 inch wafers. It should be understood that power levels may be altered substantially for smaller or larger wafers, for example, 4 inch or 12 inch wafers, and such variations are contemplated as falling within the scope of the present invention.

Note that during the patterning of the bottom electrode layer 124 (and even the barrier layer 122), the protective film 242 on the sidewalls of the capacitor stack structure 220 protect the capacitor, in particular, the dielectric 126, from contamination, thus preventing leakage associated with any such conductive contaminants. In the above manner, the performance and reliability of the resulting capacitor is improved over conventional manufacturing methodologies.

Figure 6N:
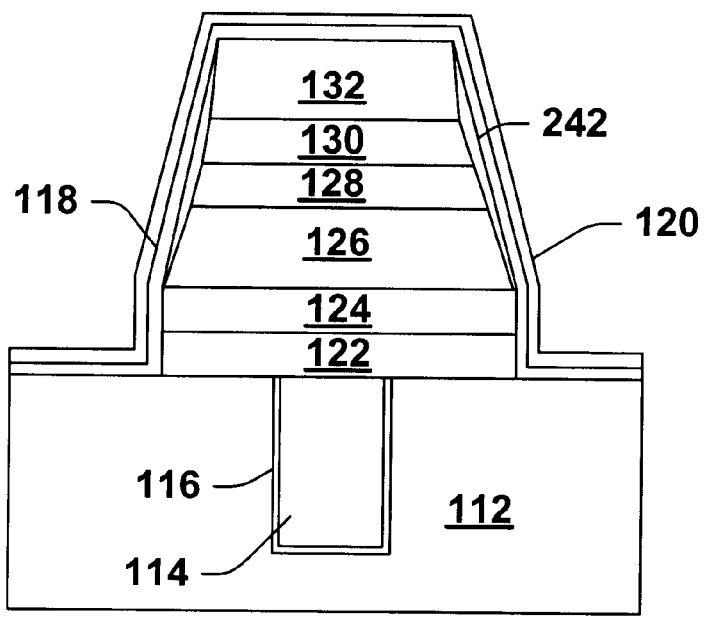

The sidewalls of the resulting capacitor of FIG. 6n typically will be fairly steep. A sidewall diffusion barrier 118, 120 is, preferably, formed at step 260 of FIG. 4 on the capacitor stack prior to the formation of layer 134 and the etching of the interconnection holes, as illustrated in FIG. 6n. The sidewall diffusion barrier 118, 120 is advantageous because it allows for the misalignment of the interconnect without shorting out the capacitor, it protects the capacitor from the diffusion of most substances into the capacitor, and it protects the rest of the structures from the out-diffusion of substances from the capacitor.

In one exemplary aspect of the present invention, the sidewall diffusion barrier is illustrated as two layers (layers 118 and 120), but the sidewall diffusion barrier may be comprised of more or fewer layers. In one example, the layer 118 is around 30 nm thick and comprises AlOx, $Ta_2O_5$, AlN, $TiO_2$, $ZrO_2$, $HfO_2$, or any stack or combination thereof; and layer 120 is around 30 nm thick and comprises silicon nitride, AlN, or any stack or combination thereof. One exemplary process for depositing the metal oxides or nitrides (which can also be carbo-oxy-nitrides especially when metalorganic precursors are used) is MOCVD under conditions with minimal free hydrogen (i.e., enough oxygen such that $H_2O$ is formed rather than $H_2$). It is also possible to use plasma enhanced CVD or MOCVD process.

Alternatively, reactive sputter deposition can be used with either $Ar+O_2$ (for oxides), $Ar+N_2$ (for nitrides) or $Ar+O_2+N_2$ (for oxy-nitrides). One exemplary process for silicon nitride is CVD or PECVD. For a low hydrogen process, the process gases should be $SiH_4$ and $N_2$, where the flow rate of $N_2$ is much greater than that of $SiH_4$. For a hydrogen free PECVD $Si_3N_4$ deposition process, then $SiCl_4+N_2$ should be used and, again, it is beneficial to have a flow rate of $N_2$ which is much greater than that of $SiCl_4$. For the example listed here, the AlOx layer is used as a Pb and H diffusion barrier while the $Si_3N_4$ layer is used as a contact etch stop.

If a subsequent via etch can be modified so that it stops on the sidewall layer (AlOx, for example) then the one layer performs as an etch stop and an additional layer (i.e. Si3N4) is not necessary. In this case, the thickness of the sidewall might need to be increased.

An alternative approach is to etch back the sidewall material after deposition. This etchback can be done after deposition of the diffusion barrier layer(s). In one preferred embodiment AlOx (approximately 40 nm is preferred) is deposited followed by an etchback using chlorine containing etch gas ($BCl_3$ or $Cl_2$ for example) followed by PECVD deposition of $Si_3N_4$ (approximately 30 nm is preferred).

If the etch damage has not yet been healed by an anneal, then the anneal can be performed after the sidewall diffusion barrier deposition. For PZT this anneal is, preferably, performed around 500–650 C. (for a furnace anneal for around 15 min to 2 hr) or 550–700 C. (for a RTA for around 10 sec to 60 sec). Even more preferred is a RTA at 650 C. for 1 min. This option is desirable if the choice of interlayer dielectric layer that is formed directly above the ferroelectric capacitor is a low-K material with a maximum thermal budget of less than around 500 C. This anneal can be performed in an oxidizing or inert atmosphere conditions.

At the beginning of the AlOx deposition process, the front side of the wafer has exposed FeRAM elements. The AlOx deposition process may or may not result in contamination of the tool (defined to be additional FeRAM contaminants on subsequent wafers at levels above care-about-level, which is around $10^{10}$ atoms/cm$^2$). If the AlOx deposition process on FeRAM wafers does not result in contamination then it is preferred to wet clean the backside of the wafer prior to depositing this sidewall diffusion barrier. If the AlOx deposition process on FeRAM wafers does result in tool contamination then the preferred backside clean can be done after this step. The wet chemistry used to clean the backside of the wafer might be different from that used the first time since the contamination of the backside is expected to have different elemental concentration levels.

Above the sidewall diffusion barrier an interlayer dielectric(s) are deposited (at step 270 of FIG. 4). A thin dielectric layer (not shown) may be formed between each of the interlevel dielectric layers (layers 112, 134 and 160). If formed, this thin layer is, for example, a silicon nitride, silicon carbide, (SiCNO) or an siliconoxide (preferably a high-density plasma oxide). In addition, interlevel dielectric layers 112, 134, and 160 comprise, for example, an oxide, FSG, PSG, BPSG, PETEOS, HDP oxide, a silicon nitride, silicon oxynitride, silicon carbide, silicon carbo-oxy-nitride, a low dielectric constant material (preferably SiLK, porous SiLK, teflon, low-K polymer (possibly porous), aerogel, xerogel, BLACK DIAMOND, HSQ, or any other porous glass material), or a combination or stack thereof. The thermal budget of the first and second ILDs (112/134) will impact FeRAM module process details. After the deposition of the second interlayer dielectric (134) the preferred process is to planarize the dielectric preferably using CMP in order to make the surface flat for subsequent lithography process. Depending on the choice of back-end metallization there are multiple processing options. For etched Al metallization, the primary option is for Al or W vias. For damascene metallization (Al or Cu is preferable) there is the choice of dual damascene (via and metal filled at same time) or separate metal vias (Al, Cu or W) filled prior to single damascene metal. All of the process routes using vias and etched metal or single damascene metal (referred to as via first) are more similar with regards to FeRAM process details compared to dual damascene approach.

An exemplary process flow for via first is as follows. Depending on the metallization scheme such as Cu, a diffusion barrier/etch stop (typically silicon carbide, silicon nitride, silicon oxygen nitride, silicon carbo-oxy-nitride) will be deposited on the ILD. Lithography will then be used to form a patterned resist. The contact etch process will then etch through following stack: antireflection coating (if present), etch stop (if present), ILD, then sidewall diffusion barrier(s) which overlie the capacitor. It is likely that a different etch process (chemistry and plasma condition) will be used for each different material (not because the via depth is less above the contacts compared to in the periphery). In the preferred embodiment where the sidewall diffusion barrier is comprised of $Si_3N_4$ on AlOx, the $Si_3N_4$ can act as an etch stop for the ILD etch. This is a standard etch for applications like gate etch where there is a height difference in the ILD thickness between various etched regions. After the ILD etch, the $Si_3N_4$ and AlOx (which is exposed by the via hole) is subsequently etched either using the same or different chemistries. In general, all of the etch steps will be timed because of the small via area. However, endpointing through some realtime measurement (optical emission or gas phase RGA) is preferred. For FeRAM damage control it is especially important to control the bottom layer sidewall barrier etch process. It is preferred to use plasma conditions with smaller plasma damage and uniform etch rates with less overetch. After the via etch process, the resist is typically removed by an ash process followed by wet clean and dry.

In one example, an anneal process step is performed at step 280 of FIG. 4 after the via etch step to remove etch damage. For a PZT capacitor dielectric, this anneal may be performed at around 500–650 C. (furnace anneal is desirably around 15 min to 2 hr) or 550–700 C. (RTA is desirable for about 10 sec to about 60 sec). Even more preferred is an RTA process at around 650 C. for around 1 min. It is also preferred that the anneal be performed in an inert atmosphere ($N_2$ or Ar) so as not to oxidize the top electrode diffusion barrier. This option is preferred if the choice of interlayer dielectric is a low-K material with a maximum thermal budget of less than 500 C. If the maximum thermal budget of the first or second ILDs (112/134) makes this impossible then it is preferred to use the maximum thermal budget possible for that ILD, using an RTA process.

Once the via has been formed, the via can be filled using a standard metallization. Typical metallizations and diffusion barriers have already been described, but include metals of Cu, W, doped Al with barriers of Ta nitride or Ti/TiN. It is preferred to use a short plasma clean (Ar, Ar+$N_2$ for example) to clean the bottom of the via prior to deposition of the barrier and metal layers in a tool without any vacuum breaks between clean and deposition. For Cu, it is preferable to use Ta, TaNx or TiN barrier followed by Cu seed layer deposition. This is, preferably, followed by electroplated or deposited copper. The Cu and barrier above the interlevel dielectric is, preferably, removed by CMP. For W vias, it is preferable to use Ti/TiN barrier followed by CVD W and the excess tungsten is removed by etchback or CMP. For Al vias, a Ti/TiN barrier is followed by Al deposition (CVD, PVD with reflow, or hot PVD). The Al on top of the ILD is either removed or patterned and etched to form metal lines.

The via etch tool, post via clean, anneal tool, metal plasma clean and even barrier deposition tool can potentially become contaminated with FeRAM elements if the top electrode and PZT are not protected by a conducting hard mask and/or a diffusion barrier or sidewall diffusion barrier. Even with this protection, etch tool contamination might occur by process mistake, such as large over-etch. Therefore depending on the process control and significant monitoring, these tools can be shared instead of being dedicated. If the decision is that these tools need to be dedicated, then it might also be decided to use a backside wet clean process after the wafer leaves the last dedicated tool in order to eliminate any chance that FeRAM contamination might spread to other non-contaminated tools.

An exemplary process flow for a dual damascene process is now described. The flow described here is the via first flow, but many of the ferroelectric-specific aspects will also apply to the other process flow routes. Depending on the metallization scheme, such as Cu, a diffusion barrier/etch stop (preferably comprised of silicon carbide, silicon nitride, silicon oxygen nitride, silicon carbo-oxy-nitride) will be deposited on the ILD. Afterwards a second intermetal layer dielectric (IMD or ILD) is deposited using one of the choices described above (which is, sometimes, followed by another diffusion barrier/etch stop). Lithography is then used to pattern the vias. The vias are then etched using the same procedure as described above, but this time there are potentially multiple layers of dielectrics prior to reaching the sidewall diffusion barrier. In addition, the aspect ratio of the first (deep) via for the dual-damascene approach is larger than with just a via. After the resist ash, via etch and clean, the first vias are filled with resist and lithography for the metal pattern is performed. The metal pattern is etched into the top dielectric and the depth is either controlled during the etch process or by an etch stop. The resist is then removed and etch debris removed by wet clean.

The next exemplary step is to perform a post etch recovery anneal and now the thermal budget is limited by more dielectric layers. For a capacitor dielectric comprised of PZT, this anneal is preferably around 500–650 C. (for a furnace anneal of around 15 min to 2 hr) or 550–700 C. (for RTA process of around 10 sec to 60 sec). Even more preferred is an RTA process at around 650 C. for around 1 min. It is also preferred that the anneal be performed in an inert atmosphere ($N_2$ or Ar) so as not to oxidize the top electrode diffusion barrier. This option is preferred if the choice of interlayer dielectric is a low K material with a maximum thermal budget of less than 500 C. If the maximum thermal budget of the ILD makes this impossible then it is preferred to use the maximum thermal budget possible for that ILD using RTA process.

The next exemplary step is to deposit the barrier and metal to simultaneously fill depressions for vias and for metal lines. Typical metallizations and diffusion barrier have already been described but for a damascene process these include Cu, W and doped Al with barriers of Ta, TaNx, or Ti/TiN. It is preferred to use a short plasma clean (Ar, Ar+$N_2$ for example) to clean the bottom of the via prior to deposition of the barrier and metal films in a tool without any vacuum breaks between clean and deposition.

The contamination issues with a dual damascene approach are similar to that of via first approach.

Interconnect 136 is formed so as to provide the electrical connection to the top electrode. The interconnect is connected to conductor 144 which is, preferably, connected to a drive line. The drive line is preferably brought to a potential around 1.2 volts during the operation of the device and this voltage will be scaled with the logic technology generation used.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. A method of forming an FeRAM capacitor, comprising:

forming a bottom diffusion barrier layer over a substrate;

forming a bottom electrode layer over the bottom diffusion barrier layer;

forming a ferroelectric dielectric layer over the bottom electrode layer;

forming a top electrode layer over the ferroelectric dielectric layer;

patterning the top electrode layer and the ferroelectric dielectric layer to form a capacitor stack structure having a top portion and sidewalls associated therewith, the capacitor stack structure overlying a first portion of the bottom electrode layer and leaving a second portion of the bottom electrode layer exposed;

forming a protection layer over the stack structure and the second portion of the bottom electrode layer, wherein the protection layer covers the sidewalls associated with the capacitor stack structure;

etching the protection layer, wherein the etching removes a portion of the protection layer on the top portion of the capacitor stack structure and a portion of the protection layer on the second portion of the bottom electrode layer, but leaves at least a portion of the protection layer on the sidewalls of the capacitor stack structure, thereby leaving a protective sidewall layer on the sidewalls of the capacitor stack structure;

removing the second portion of the bottom electrode layer, whereby the protective sidewall layer on the sidewalls of the capacitor stack structure prevent contamination associated with the removed second portion of the bottom electrode layer from interfering with the capacitor stack structure.

2. The method of claim 1, wherein etching the protection layer comprises performing a substantially anisotropic etch which his substantially selective to the top portion of the capacitor stack structure and the bottom electrode layer, respectively.

3. The method of claim 1, wherein forming the protection layer comprises forming an AlOx film over the capacitor stack structure and the second portion of the bottom electrode layer.

4. The method of claim 3, wherein the AlOx film has a thickness on the sidewalls of the capacitor stack structure of about 80 Angstroms or more and about 200 Angstroms or less.

5. The method of claim 3, wherein forming the AlOx film comprises depositing the AlOx film using chemical vapor deposition.

6. The method of claim 5, wherein forming the AlOx film comprises depositing the AlOx film using metal organic chemical vapor deposition with is aluminum precursors.

7. The method of claim 6, wherein forming the AlOx film further comprises performing the metal organic chemical vapor deposition with $O_2$, $H_2O$, NO, $NO_2$ or $O_3$.

8. The method of claim 3, wherein forming the AlOx film comprises performing a reactive sputtering using an aluminum target with an ArO or an ArN ambient gas with an RF power or pulsed DC power applied thereto in deposition a chamber having a pressure of about 5 mTorr.

9. The method of claim 8, wherein the ambient gas comprises ArO and a Ar/O gas ratio is about 20% or more oxygen and about 60% or less oxygen.

10. The method of claim 8, wherein the ambient gas comprises ArN and a Ar/N gas ratio is about 30% or more nitrogen and about 70% or less nitrogen.

11. The method of claim 3, wherein etching the AlOx protection layer comprises performing a dry etch with an etch chemistry of Cl2 and O2 with a fluorine containing gas.

12. The method of claim 11, wherein the fluorine containing gas comprises CF4, CxFy, or CxHyFz.

13. The method of claim 3, wherein forming the protection layer further comprises forming an AlN film over the AlOx film.

14. The method of claim 13, wherein the AlN film has a thickness on the sidewall portion of the capacitor stack structure of about 400 Angstroms.

15. The method of claim 13, wherein forming the protection layer comprises depositing the AlOx film and the AlN film using physical vapor deposition.

16. The method of claim 13, wherein etching the AlN film and the AlOx film comprising the protection layer comprises:

etching the AlN film with a Cl2 etch chemistry; and etching the AlOx film with an etch chemistry of Cl2 and O2 with a fluorine containing gas.

17. The method of claim 1, further comprising forming and patterning a hard mask layer over the top electrode layer prior to the patterning step which forms the capacitor stack structure, wherein the patterned hard mask layer serves as a mask to define the capacitor stack structure during the patterning of the top electrode layer and the ferroelectric dielectric layer.

18. The method of claim 1, further comprising:

forming a transistor structure in the substrate;

forming an interlevel dielectric layer over the transistor structure; and forming one or more vias and one or more respective contact regions down to one or more portions of the transistor structure prior to forming the bottom diffusion layer over the substrate.

19. The method of claim 1, wherein the protection layer comprises an electrically insulative material.

20. A method of forming an FeRAM capacitor, comprising:

forming a bottom electrode layer, a ferroelectric dielectric layer and a top electrode layer over a substrate;

patterning the top electrode layer and the ferroelectric dielectric layer, thereby defining sidewalls associated therewith;

forming a protection layer on the sidewalls of the top electrode layer and the ferroelectric dielectric layer; and patterning the bottom electrode layer after forming the protection layer, thereby protecting the sidewalls of the top electrode layer and the ferroelectric layer from contamination associated with the patterning of the bottom electrode layer.

21. The method of claim 20, wherein forming the protection layer on the sidewalls further comprises:

forming a protective layer over the patterned top electrode layer and ferroelectric dielectric layer, thereby covering an exposed portion of the bottom electrode layer not covered by the patterned top electrode layer and ferroelectric dielectric layer, as well as covering a top portion and the sidewalls of the patterned top electrode layer and ferroelectric dielectric layer; and performing a substantially anisotropic etch of the protective layer, wherein the substantially anisotropic etch removes the protective layer on the exposed portion of the bottom electrode layer and the top portion of the patterned top electrode layer and ferroelectric dielectric layer, and further wherein the substantially anisotropic etch leaves a portion of the protective layer on the sidewalls of the patterned top electrode layer and ferroelectric dielectric layer, thereby defining the protection layer on the sidewalls.

22. The method of claim 20, wherein patterning the top electrode layer and the ferroelectric dielectric layer defines a capacitor stack structure, and wherein forming the protective layer comprises forming an AlOx film over the capacitor stack structure and the second portion of the bottom electrode layer.

23. The method of claim 22, wherein the AlOx film has a thickness on the sidewalls of the capacitor stack structure of about 80 Angstroms or more and about 200 Angstroms or less.

24. The method of claim 22, wherein forming the AlOx film comprises depositing the AlOx film using chemical vapor deposition.

25. The method of claim 24, wherein forming the AlOx film comprises depositing the AlOx film using metal organic chemical vapor deposition with aluminum precursors.

26. The method of claim 25, wherein forming the AlOx film further comprises performing the metal organic chemical vapor deposition with $O_2$, $H_2O$, NO, $NO_2$ or $O_3$.

27. The method of claim 22, wherein forming the AlOx film comprises performing a reactive sputtering using an aluminum target with an ArO or an ArN ambient gas with an RF power or pulsed DC power applied thereto in deposition a chamber having a pressure of about 5 mTorr.

28. The method of claim 27, wherein the ambient gas comprises ArO and a Ar/O gas ratio is about 20% or more oxygen and about 60% or less oxygen.

29. The method of claim 27, wherein the ambient gas comprises ArN and a Ar/N gas ratio is about 30% or more nitrogen and about 70% or less nitrogen.

30. The method of claim 22, wherein etching the AlOx protection layer comprises performing a dry etch with an etch chemistry of Cl2 and O2 with a fluorine containing gas.

31. The method of claim 30, wherein the fluorine containing gas comprises CF4, CxFy, or CxHyFz.

32. The method of claim 22, wherein forming the protection layer further comprises forming an AlN film over the AlOx film.

33. The method of claim 32, wherein the AlN film has a thickness on the sidewall portion of the capacitor stack structure of about 400 Angstroms.

34. The method of claim 32, wherein forming the protection layer comprises depositing the AlOx film and the AlN film using physical vapor deposition.

35. The method of claim 32, wherein etching the protection layer comprising the AlN film and the AlOx film comprises:
   etching the AlN film with a Cl2 etch chemistry; and
   etching the AlOx film with an etch chemistry of Cl2 and O2 with a fluorine containing gas.

36. The method of claim 20, further comprising forming and patterning a hard mask layer over the top electrode layer prior to the patterning of the top electrode layer and the ferroelectric dielectric layer which defines a capacitor stack structure, wherein the patterned hard mask layer serves as a mask to define the capacitor stack structure during the patterning of the top electrode layer and the ferroelectric dielectric layer.

37. The method of claim 20, further comprising:
   forming a transistor structure in the substrate;
   forming an interlevel dielectric layer over the transistor structure; and
   forming one or more vias and one or more respective contact regions down to one or more portions of the transistor structure prior to forming the bottom diffusion layer over the substrate.

38. The method of claim 20, wherein the protection layer comprises an electrically insulative material.

* * * * *